(12) United States Patent
Katagiri et al.

(10) Patent No.: US 6,721,172 B2
(45) Date of Patent: Apr. 13, 2004

(54) MECHANISM FOR INSERTING AND REMOVING ELECTRONIC CIRCUIT UNIT

(75) Inventors: Hiroshi Katagiri, Kawasaki (JP); Katsuya Fujii, Kawasaki (JP); Tetsuya Takahashi, Kawasaki (JP); Yoshinori Hoshino, Kawasaki (JP); Satoshi Ueda, Kawasaki (JP); Yoshiyuki Sato, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/267,370

(22) Filed: Oct. 9, 2002

(65) Prior Publication Data

US 2004/0001304 A1 Jan. 1, 2004

(30) Foreign Application Priority Data

Jun. 27, 2002 (JP) ........................................ 2002-188324

(51) Int. Cl.$^7$ ................................................. H05K 7/16
(52) U.S. Cl. .................. 361/679; 312/223.2; 174/35 R; 248/534
(58) Field of Search ................................. 361/674–687, 361/724–727; 312/223.1, 223.6; 174/35 GC, 35 R; 248/534; 200/336, 52 R; 29/759; 439/159, 74

(56) References Cited

U.S. PATENT DOCUMENTS 4,236,190 A * 11/1980 Hollingsead et al. ........ 361/725
6,595,786 B2 * 7/2003 Horiuchi et al. .............. 439/74
6,625,014 B1 * 9/2003 Tucker et al. ................ 361/685

* cited by examiner

Primary Examiner—Hung Van Duong
(74) Attorney, Agent, or Firm—Katten Muchin Zavis Rosenman

(57) ABSTRACT

In a mechanism for inserting and removing electronic circuit units against a shelf of an electrical device where the electronic circuit units are installed, the shelf includes a groove forming part, the electrical circuit unit includes a rotatable lever, a rotatable stopper, and a housing member, and the electrical circuit unit is locked with the shelf by rotating the lever.

11 Claims, 30 Drawing Sheets

MECHANISM FOR INSERTING AND REMOVING ELECTRONIC CIRCUIT UNIT

BACKGROUND OF THE INVENTION

1. Field of the Invention

The present invention generally relates to mechanisms for inserting and removing electronic circuit units, and more particularly, to a mechanism for inserting and removing electronic circuit units for an electronic device, such as a communication device, an information processing apparatus, and a measurement apparatus, having a shelf where a large number of the electronic circuit units are installed.

2. Description of the Related Art

An electronic circuit unit is installed in a shelf of an electronic device, such as a communication device, an information processing apparatus, and a measurement apparatus. A lever for inserting and removing is rotatably attached to the electronic circuit unit. The electronic circuit unit is connected to a connector on the back board of the shelf by rotating the lever. The electronic circuit unit is locked with the shelf in order to connect the electronic circuit unit to the connector securely, so that a connection for electric signals is accomplished.

FIG. 1 is a view for explaining a conventional mechanism for inserting and removing electronic circuit units. FIG. 2 is an exploded perspective view of a lever 12 for inserting and removing.

Referring to FIGS. 1 and 2, electronic circuit units 10 are mounted on a shelf 20 having a box configuration. The electronic circuit unit 10 includes the levers 12 for inserting and removing, stoppers 13, and receiving parts 14. The levers 12 for inserting and removing are rotatably attached to upper and lower parts of the front end part of an electronic circuit board 11. The stopper 13 is attached to the lever 12 for inserting and removing so as to be rotated by a spring 19 shown in FIG. 2, wherein a pin 16 is the center of the rotation of the stopper 13. The stopper 13 is received by the receiving part 14. The mechanism for inserting and removing the electronic circuit unit 10 consists of the lever 12 for inserting and removing, the stopper 13, and the receiving part 14.

FIG. 3 is a view for explaining an insertion of the electronic circuit unit 10 shown in FIG. 1 to the shelf 20 and a lock operation. Since the mechanism for inserting and removing provided at an upper part of the front end part of the electronic circuit unit 10 acts substantially the same as the mechanism for inserting and removing provided at a lower part of the front end part of the electronic circuit unit 10, only the mechanism for inserting and removing provided at the lower part of the front end part of the electronic circuit unit 10 will be described and explanation of the mechanism for inserting and removing provided at the upper part of the front end part of the electronic circuit unit 10 will be omitted.

In a state shown in FIG. 3-(A), first the electronic circuit unit 10 shown in FIG. 1 is inserted to the shelf 20, and then the lever 12 for inserting and removing is rotated counterclockwise. A claw part 15 comes in contact with a frame 21 of the shelf 20. The lever 12 is rotated counterclockwise based on the leverage. And thereby, the stopper 13 comes in contact with the receiving part 14.

In a state shown in FIG. 3-(B), the lever 12 for inserting and removing is further rotated counterclockwise. The stopper 13 is rotated clockwise in a state where the pin 16 is the center of the rotation of the stopper 13, so that the stopper 13 is situated at an upper part of the receiving part 14.

In a state shown in FIG. 3-(C), the lever 12 for inserting and removing is further rotated counterclockwise, so that the electronic circuit unit 10 shown in FIG. 1 is further inserted to the shelf 20. The stopper 13 is situated on a concave part 17 of the receiving part 14, and thereby the stopper 13 is locked with the receiving part 14. In this case, a gap having a distance y between the right end of the frame 21 and the front end of the electronic circuit board 11 is made.

A surface board is provided to the electronic circuit unit 10. A shield gasket is provided around the surface board so as to shield against the leakage of an electromagnetic wave to the outside.

Meanwhile, recently, technology has progressed so that signals connected by the connector have a high frequency. Because of this, the length of a contact pin at the connection part of the connector has become short. Hence, it is required to make a secure connection between the connector of the electronic circuit unit and the connector of the back board.

However, the conventional mechanism for inserting and removing electronic circuit unit 10 has problems with regard to the connection of the connector.

First of all, the conventional mechanism for inserting and removing electronic circuit unit 10 has a backlash, namely play with respect to the lock by the lever 12 for inserting and removing. Hence, it is difficult to assure the connection of the connector securely.

That is, in a state shown in FIG. 3-(C), the stopper 13 is rotated clockwise wherein a pin 16 is the center of the rotation of the stopper 13, so that the stopper 13 is moved on the concave part 17 of the receiving part 14. And thereby, a gap having a distance X between a right end of the concave part 17 and the stopper 13 is made. Accordingly, in a state shown in FIG. 3-(C), if a force for pulling the electronic circuit unit 10 from the shelf 20 due to a vibration, for example, is applied to the electronic circuit unit 10, that is, if a force is applied to the electronic circuit unit 10 in an opposite direction to the insertion direction of the electronic circuit unit 10 to the shelf 20 (in a right side direction in FIG. 3-(C)), a state shown in FIG. 3-(D) occurs. That is, the gap having the distance X between the stopper 13 and the concave part 17 of the receiving part 14 is closed and the gap between the right end of the frame 21 and the front end of the electronic circuit board 11 is increased from the distance y to a distance y+z.

That means, even if the electronic circuit unit 10 shown in FIG. 1 is inserted to the shelf 20 and the stopper 13 is situated on the concave part 17 of the receiving part 14 so that the stopper 13 is locked with the receiving part 14 as shown in FIG. 3-(C), backlash, namely play having a distance Z with respect to the lock by the lever 12 occurs in the conventional mechanisms for inserting and removing the electronic circuit unit 10. Hence, it is difficult to assure the connection of the connector securely in the conventional mechanisms for inserting and removing the electronic circuit unit 10.

Second, a shield gasket is provided around the surface board of the electronic circuit unit 10 in the vicinity of the lever 12 for inserting and removing, so as to shield leakage of the electromagnetic wave from the electronic circuit unit to the outside. In a case where an attempt is being made to connect the electronic circuit unit 10 to the shelf 20 by the lever 12 for inserting and removing, the electronic circuit unit 10 is at first manually pushed to be inserted. And then, the lever 12 for inserting and removing is rotated counterclockwise to connect the electronic circuit unit 10 to the shelf 20, as the operator feels a resistant force (an elastic force) against the insertion of the electronic circuit unit 10, which is caused by the contact to the shield gaskets of neighboring electronic circuit units.

However, the timing when the operator feels the resistant force (the elastic force) does not always coincide with the timing when the lever 12 for inserting and removing should be rotated to connect the electronic circuit unit 10 to the shelf 20. Hence, the lever 12 for inserting and removing is rotated in error before the electronic circuit unit 10 is positioned to start being connected to the shelf 20. That is, it is difficult for the operator to determine to start connecting the electronic circuit unit 10 to the shelf 20 by rotating the lever 12 for inserting and removing, due to the resistant force (the elastic force) of the shield gasket. Because of this, it is not possible to securely connect the electronic circuit unit 10 to the shelf 20 by rotating the lever 12 for inserting and removing.

SUMMARY OF THE INVENTION

Accordingly, it is a general object of the present invention to provide a novel and useful mechanism for inserting and removing an electronic circuit unit, in which one or more of the problems described above are eliminated.

Another and more specific object of the present invention is to provide a mechanism for inserting and removing electronic circuit units wherein connectors of the electronic circuit units are connected to connectors of the back boards securely.

The above objects of the present invention are achieved by a mechanism for inserting and removing electronic circuit units against a shelf of an electrical device where the electronic circuit units are installed, wherein the shelf includes a groove forming part, the electrical circuit unit includes a rotatable lever having a head end where a fixing part is provided; a rotatable stopper connected to the lever and having a head end where an engaging part is provided; and a housing member housing the lever and the stopper where an engaging surface engaging with the engaging part of the stopper is provided inside thereof, the electrical circuit unit is locked with the shelf by rotating the lever so as to engage the groove forming part of the shelf with the engaging part of the stopper, and the engagement between the engaging surface of the housing member and the engaging part of the stopper is not off even if a force to lift the lock is applied to the electrical circuit unit.

According to the above mentioned invention, the fixing part of the lever is fixed to the groove forming part of the shelf by rotating the lever so that the electrical circuit unit is locked with the shelf. Even if the force to lift the lock is applied to the electrical circuit unit, the engagement between the engaging surface of the housing member and the engaging part of the stopper is not off (not terminated). Hence, it is possible to accomplish locking by the lever not having play and thereby securely connect with a connector having even a short connection length.

The housing member may further include a rotation stopping part, and the lever cannot be moved, after the lever is further rotated so that the lever comes in contact with the rotation stopping part.

According to the above mentioned invention, when the lever comes in contact with the rotation stopping part, the lever cannot be further rotated. Therefore, further leverage applied to the lever cannot work so as to prevent damages based on the connection between the connector of the electronic circuit unit and the connector of the back board wiring board of the shelf.

The housing member may further include an engaging lifting guide surface, and the engaging part of the stopper may be guided on the engaging lifting guide surface by rotating the stopper and then the lever may be rotated, so that the lock between the electrical circuit unit and the shelf is off.

According to the above mentioned invention, it is possible to rotate the stopper with a light force. Hence, it is possible to lift the lock between the electrical circuit unit and the shelf by a simple operation.

The above object of the present invention is achieved by a mechanism for inserting and removing electronic circuit units against a shelf of an electrical device where the electronic circuit units are installed, wherein the shelf includes a groove forming part, the electrical circuit unit includes a rotatable lever having a head end where a fixing part is provided; a rotatable stopper connected to the lever and having a head end where an engaging part is provided; and a housing member housing the lever and the stopper where a projection part fixing an insertion guide surface where the engaging part is guided to the stopper by rotating the lever is provided inside thereof, and if a designated force is applied to the lever, the lever is rotated and the fixing part of the lever is engaged with the groove forming part of the shelf, and fixing of the stopper by the projection part of the housing member is lifted so that the engaging part of the stopper comes in contact with the insertion guide surface.

According to the above mentioned invention, fixing of the stopper is lifted. And thereby, the stopper slides on the projection part, the engaging part of the stopper moves in a direction of the insertion guide surface, and the lever is rotated. Therefore, the operator can easily determine visually when lock operation by rotating the lever with his finger can be started.

The stopper may further include another groove forming part, and the stopper may be fixed to the projection part by engaging the other groove forming part with the projection part of the housing member.

According to the above mentioned invention, it is possible to engage the groove forming part of the stopper with the projection part of the housing member securely, so that the stopper can be fixed securely.

Other objects, features, and advantages of the present invention will become more apparent from the following detailed description when read in conjunction with the accompanying drawings.

DETAILED DESCRIPTION OF THE PREFERRED EMBODIMENTS

A description will now be given, with reference to FIGS. 4 through 33, of embodiments of the present invention.

Figure 1:
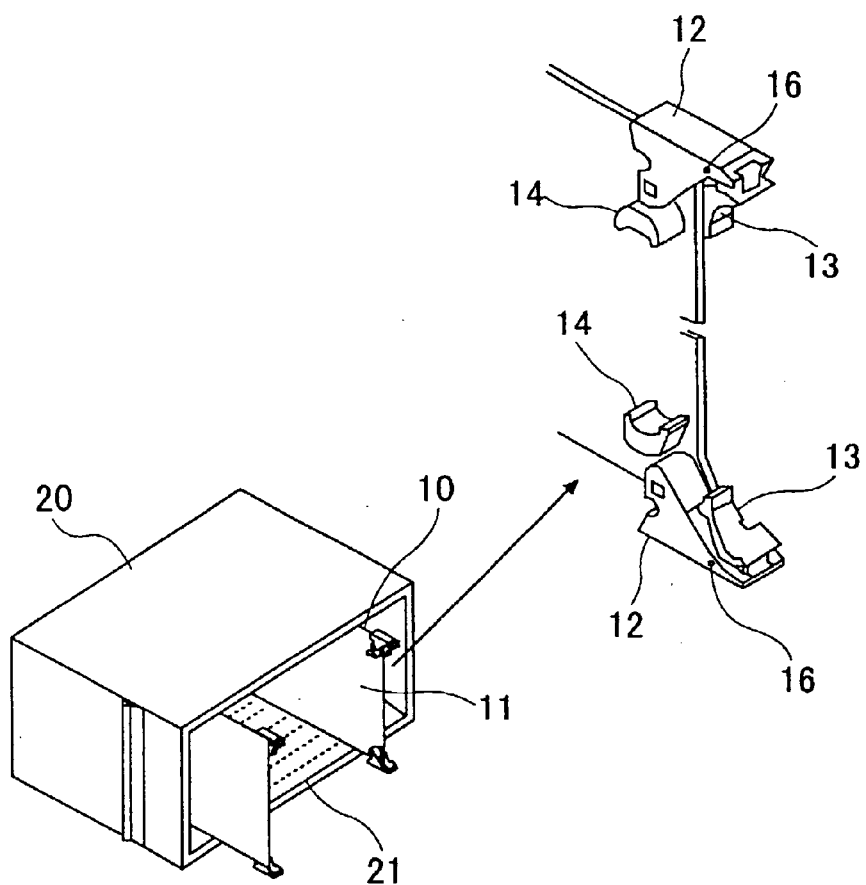
FIG. 1 is a view for explaining a conventional mechanism for inserting and removing electronic circuit units.
Figure 2:
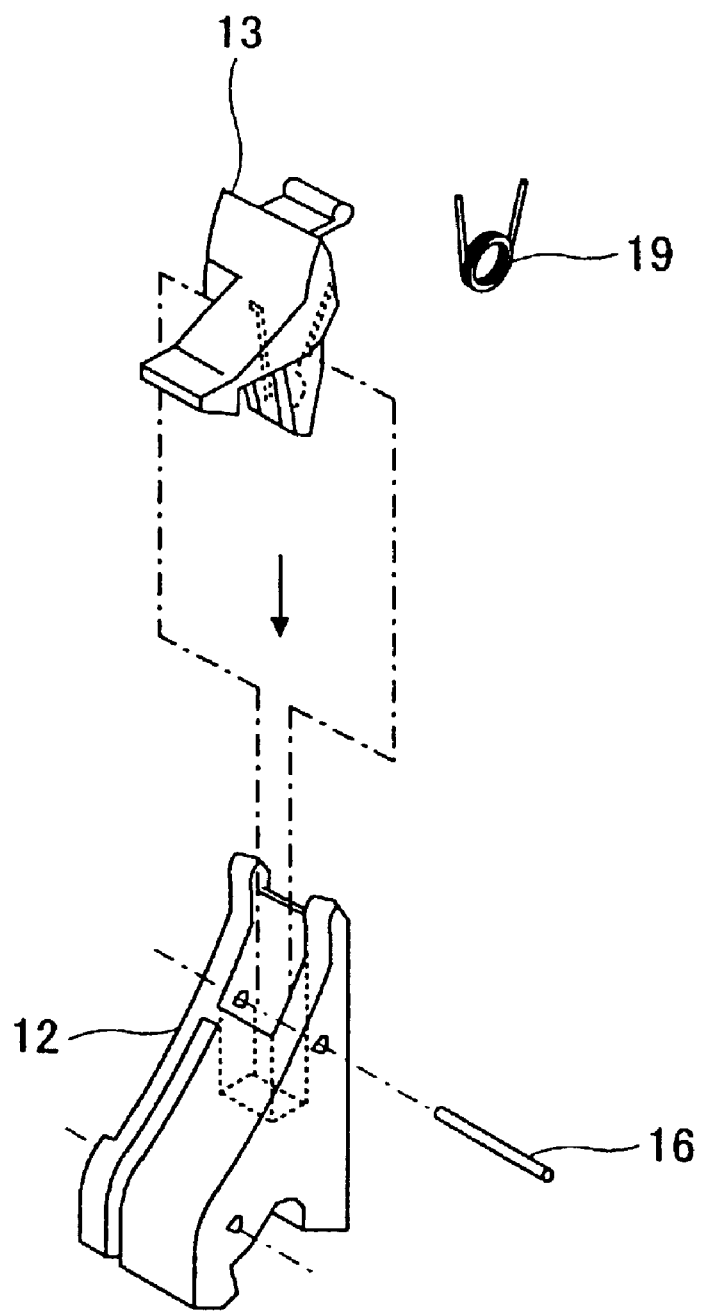
FIG. 2 is an exploded perspective view of a lever 12 in FIG. 1 for inserting and removing.
Figure 3:
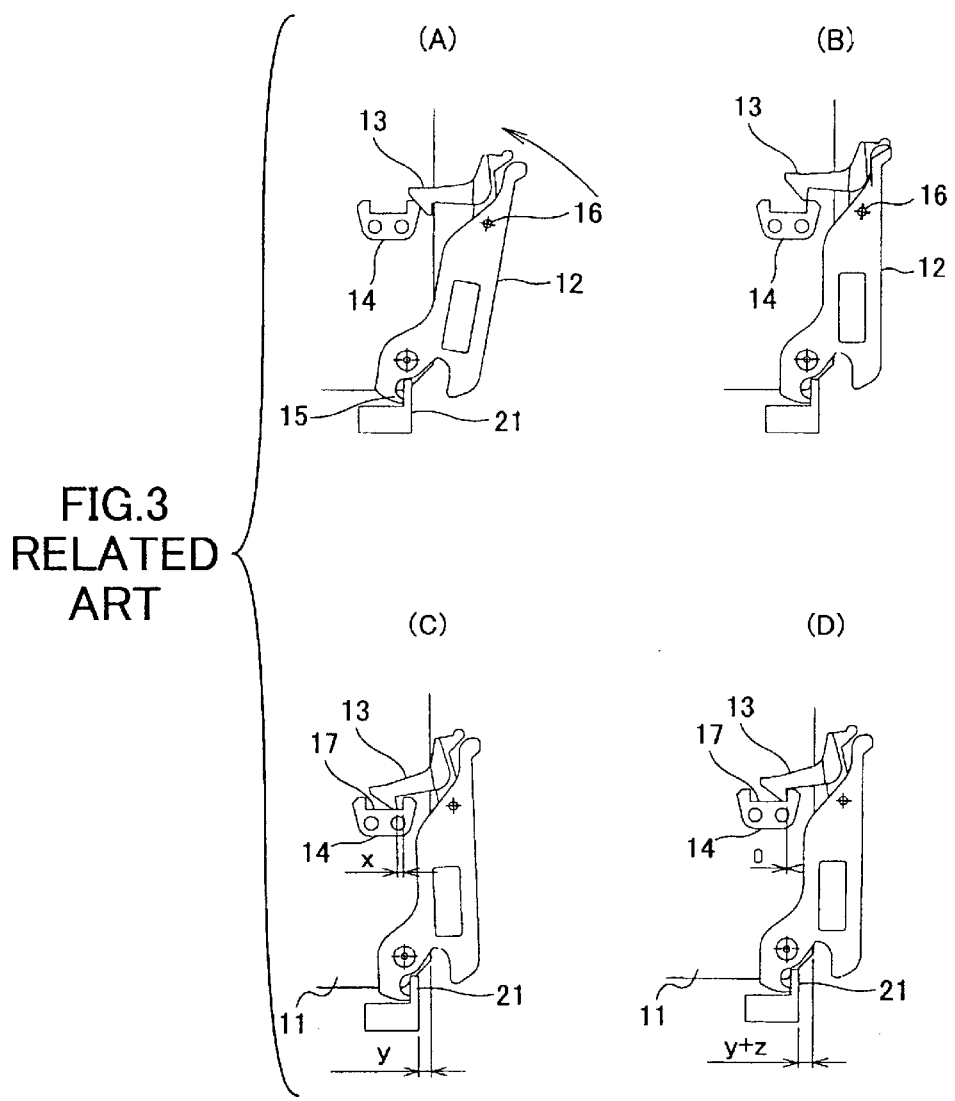
FIG. 3 is a view for explaining an insertion of the electronic circuit unit 10 shown in FIG. 1 to the shelf 20 and a lock operation.
Figure 4:
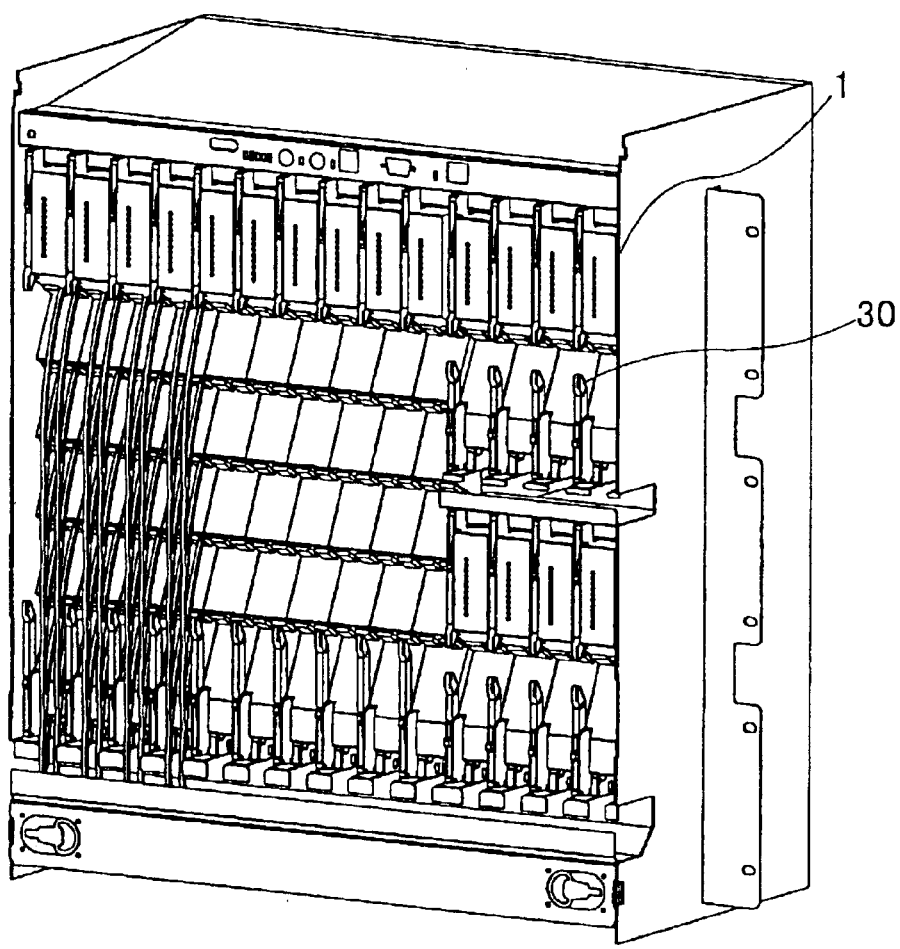
FIG. 4 is a view of an exterior of a communication apparatus 5, where electronic circuit units 1 having levers 30 for inserting and removing according to the present invention are mounted.

FIG. 4 is a view of an exterior of a communication apparatus 5, where electronic circuit units 1 having levers 30 for inserting and removing according to the present invention are mounted. Referring to FIG. 4, a large number of the electronic circuit units 1 are mounted to the communication apparatus 5 by operating the levers 30.

Figure 5:
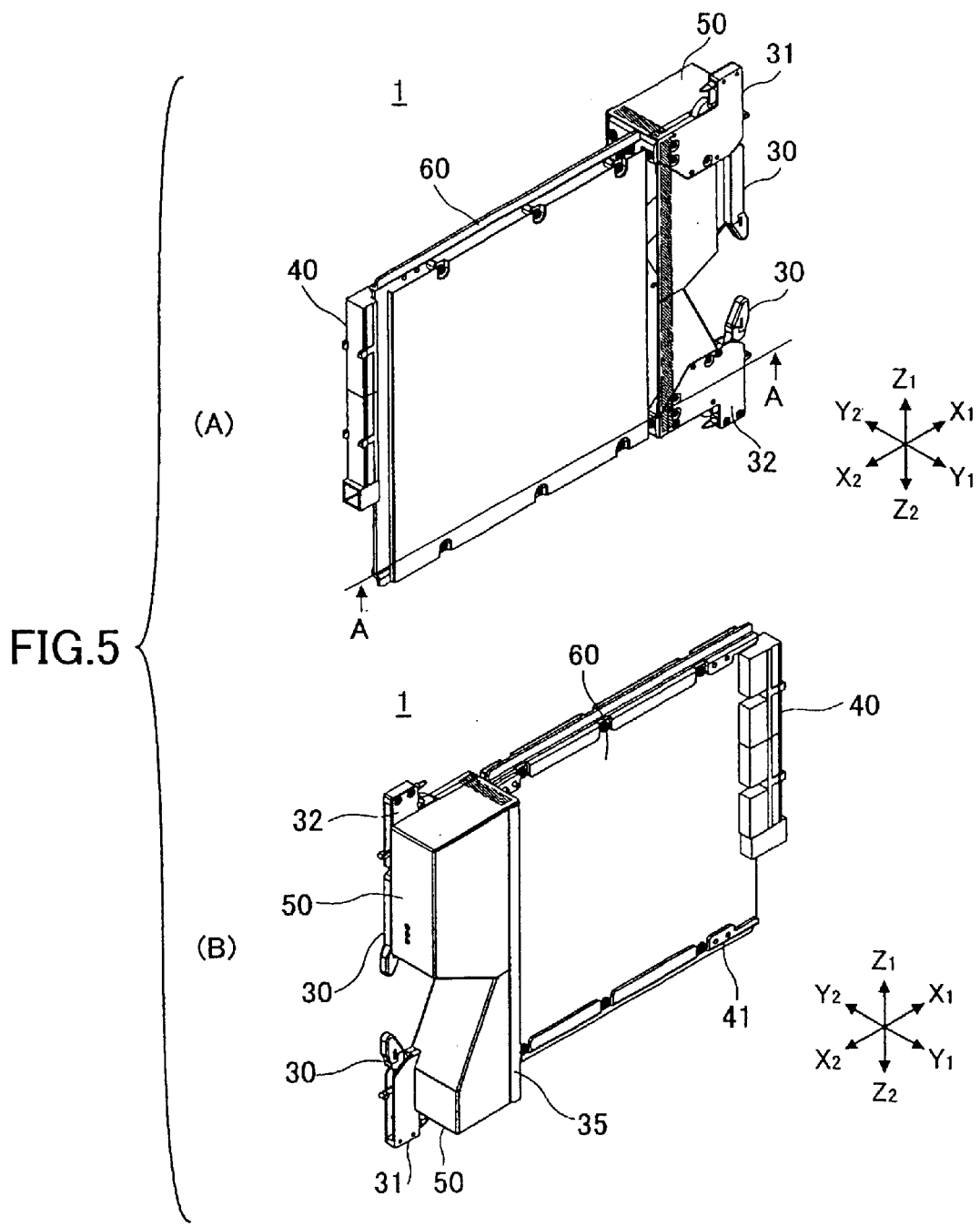
FIG. 5 is a view of an exterior of the electronic circuit unit 1 wherein the levers 30 for inserting and removing according to the present invention are provided at upper and lower parts of the electronic circuit unit 1.

FIG. 5 is a view of an exterior of the electronic circuit unit 1 wherein the levers 30 for inserting and removing according to the present invention are provided at upper and lower parts of the electronic circuit unit 1. More particularly, FIG. 5-(A) is a perspective view of the electronic circuit unit 1 seen from the side of a connector part 40, and FIG. 5-(B) is a perspective view of the electronic circuit unit 1 seen from the side of the levers 30.

Referring to FIG. 5, the electronic circuit unit 1 consists of an electronic circuit board 60, the connector part 40 provided at an end part of the electronic circuit board 60, surface boards 50 provided at upper and lower parts of the other end part of the electronic circuit board 60 situated at opposite sides to the connector part 40, two of the levers 30 provided at the respective surface boards 50, and others.

The respective levers 30 are sandwiched between housing parts 31 and cover parts 32, and provided at the upper and lower parts of the surface board 50. The housing part 31 and the cover part 32 may be called a housing member that houses the lever 30 and others. It is not always necessary to provide the levers 30 to both the upper and lower parts of the surface board 50. The lever 30 may be provided at only the upper or lower part of the surface board 50. The levers 30 provided to the upper and lower parts of the surface boards 50 have the same structures except for a pin 31-6 described later and shown in FIG. 9.

A guide rail 41 is provided at a lower part of the electronic circuit unit 1, so that the electronic circuit unit 1 can be slid on a guide part 101 (shown in FIG. 6 and described later) of the shelf 100 of the communication apparatus 5 wherein the electronic circuit unit 1 is mounted.

Hatched parts of the surface board 50, the housing part 31, and the cover part 32 shown in FIG. 5, are surfaces that contact with a shield gasket 105 (described later and shown in FIG. 6) of the shelf 100 or another neighboring electronic circuit unit.

Figure 6:
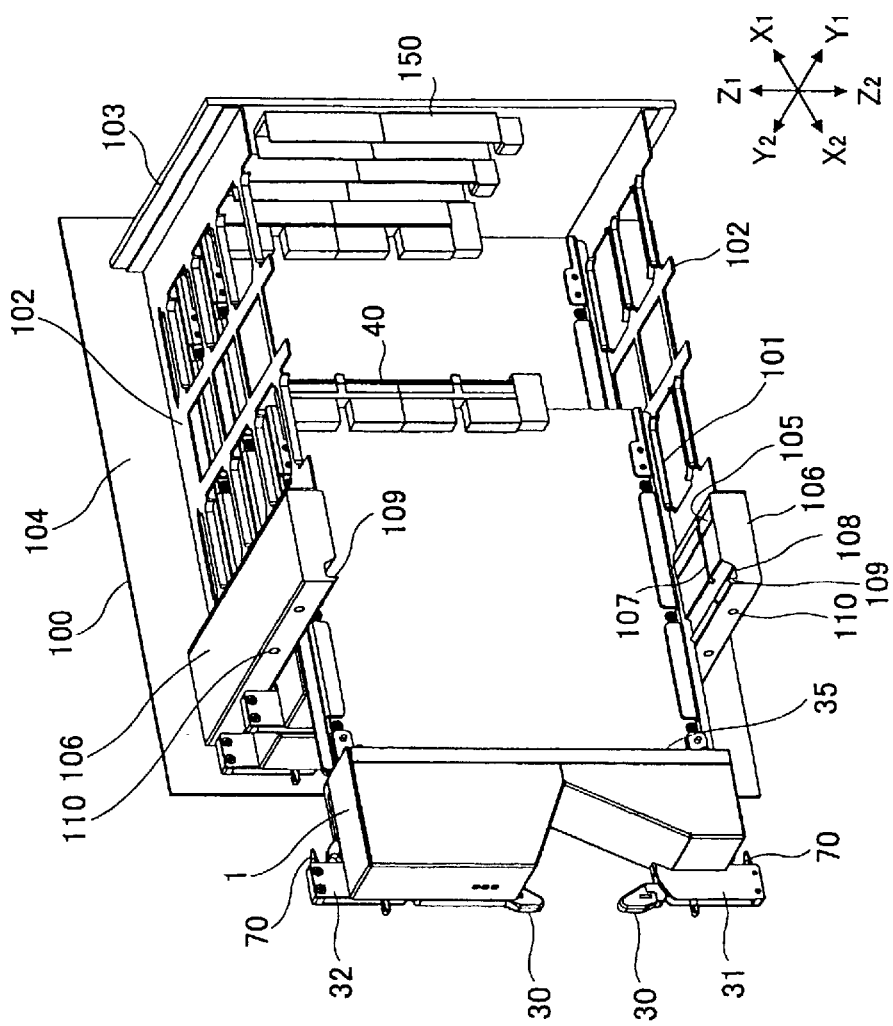
FIG. 6 is a view of an exterior showing a state where the electronic circuit unit 1 is mounted to a shelf 100.

As shown in FIG. 5, the shield gasket 105 shown in FIG. 6 comes in contact with not only the surface board 50 but also rear end parts of the housing part 31 and the cover part 32. In addition, a shield gasket 35 is provided to a side of the surface board 50 opposite to the side where the lever 30 is positioned. Because of the above mentioned structure, the housing part 31 and the cover part 32 form a shield structure with the surface board 50, so that it is possible to shield leakage of an electromagnetic wave from the electronic circuit unit 1 to the outside. Furthermore, because of this structure, in a case where the surface board 50 is to be made of sheet metal, it is possible to form a configuration of the surface board 50 easily. In this case, it is preferable that the housing part 31 and the cover part 32 are made of metal. If the housing part 31 and the cover part 32 are made of resin, it is preferable to implement to cover their surfaces with conductive materials.

Next, the shelf 100 provided inside of the communication apparatus 5, wherein the above described electronic circuit unit 1 is mounted, will be described.

FIG. 6 is a view of an exterior showing a state where the electronic circuit unit 1 is mounted to a shelf 100.

Referring to FIG. 6, the shelf 100 consists of guide boards 102, a side board 104, front frames 106, a back board wiring board 103, and others. The guide boards 102 are provided at upper and lower parts of the shelf 100. The side board 104 is provided between the guide board 102 provided at the upper part of the shelf 100 and the guide board 102 provided at the lower part of the shelf 100. The front frame 106 is provided at an end part in an X2 direction of the guide board 102. The back board wiring board 103 is provided at an end part in an X1 direction of the guide board 102.

A large number of guide parts 101 are provided at the guide board 102. The guide rail 41 (shown in FIG. 5) provided at the lower part of the electronic circuit unit 1 is situated on the guide part 101, so that the electronic circuit unit 1 can be slid. A connector 150 which can be connected to the connector part 40 of the electronic circuit unit 1 is provided on the back board wiring board 103.

The shield gaskets 105 are provided on surfaces of the front frames 106 facing each other, which front frames 106 are provided at the upper and lower parts of the shelf 100. The shield gaskets 105 come in contact with the surface board 50 and the rear parts of the housing part 31 and the cover part 32 so as to form a shield structure with a shield gasket provided at the side board 104. And thereby, it is possible to shield leakage of an electromagnetic wave from the electronic circuit unit 1 to an outside.

A guide groove forming part 107 is formed on an upper surface of the front frame 106 provided at a lower part of the shelf 100. The guide groove forming part 107 forms a straight line in an X1–X2 direction with the guide part 101. Therefore, as well as the guide part 101, the guide rail 41 (shown in FIG. 5) provided at a lower part of the electronic circuit unit 1 is situated on the guide groove forming part 107, so that the electronic circuit unit 1 can be slid.

A groove forming part 108 is formed in the surface at a side of the X2 direction of the front frame 106. A projection part 109 is formed by the groove forming part 108 and the surface at the side of the X2 direction of the front frame 106.

Furthermore, guide hole forming parts 110 for positioning the electronic circuit unit 1 to the shelf 100 are provided on the surface at a side of an X2 direction of the front frame 106. That is, the guide pins 70 provided at vicinities of the levers 30 provided at the upper and lower parts of the electronic circuit unit 1 are inserted into the guide hole forming parts 110 provided on the surface at the side of an X2 direction of the front frame 106 provided at upper and lower parts of the electronic circuit unit 1. Because of this, the electronic circuit unit 1 is positioned to the shelf 100.

Figure 7:
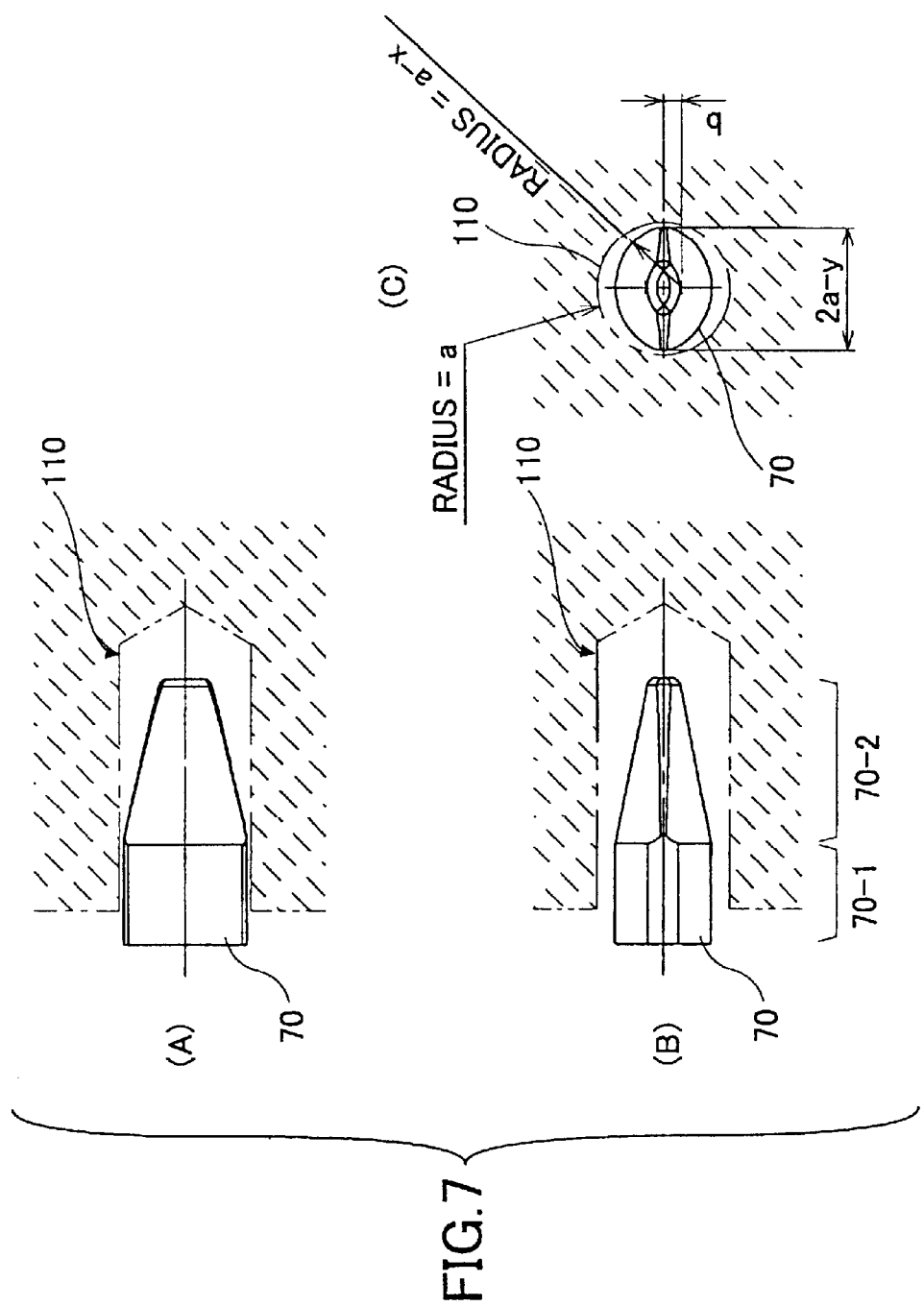
FIG. 7 is a view showing a state where a guide pin 70 is inserted into a guide hole forming part 110 according to the present invention.

Here, a structure of the guide pin 70 will be described with reference to FIG. 7. FIG. 7 is a view showing a state where the guide pin 70 is inserted into the guide hole forming part 110. More particularly, FIG. 7-(A) is a cross-sectional view taken on the X-Y plane in FIG. 6, FIG. 7-(B) is a cross-sectional view taken on the X-Z plane in FIG. 6, and FIG. 7-(C) is a cross-sectional view taken on the Y-Z plane in FIG. 6.

Referring to FIG. 7-(B), the guide pin 70 consists of a positioning part 70-1 and a guide part 70-2.

Referring to FIG. 7-(C), the width in the Y1–Y2 directions of the guide pin 70 shown in FIG. 6 is shorter than a diameter $2a$ of the guide hole forming part 110 by a length $y$ in the cross section of the Y-Z surface of the positioning part 70-1. The guide pin 70 is positioned against the guide hole forming part 110 in right and left directions (the Y1–Y2 direction) by the positioning part 70-1. Because of this, even if the surface board 50 is pushed by the elastic force of the shield gasket between the neighboring electronic circuit units, the guide pin 70 can be inserted into the guide hole forming part 110 securely.

For example, assuming that the guide pin 70 does not have the above mentioned structure, in a case where a plurality of the electronic circuit units 1 are mounted to the shelf 100, if one of the electronic circuit units 1 is mounted to a center of the shelf 100 last, the surface boards of the right and left electronic circuit units are pushed to the sides, where the electronic circuit unit is not mounted, by the elastic force of the shield gasket. Therefore, in this case, the width of a part of the shelf 100, where the center electronic circuit unit is inserted, is too narrow to insert the center electronic circuit unit. However, according to the structure of the guide pin 70 of the present invention, it is possible to prevent the above mentioned problem.

Furthermore, a gap is provided in upper and lower directions of the guide hole forming part 110 (Z1–Z2 directions) so as to cancel a problem of measurement error between the guide hole forming part 110 positioned at the upper part of the shelf 100 and the guide hole forming part 110 positioned at the lower part of the shelf 100. The measurement error between the guide hole forming parts 110 positioned at the upper and lower parts of the shelf 100 is caused by an accumulation of dimensional tolerance of a large number of parts forming the shelf 100. Similarly, an measurement error between the guide pin 70 positioned at the upper and lower parts of the electronic circuit unit 1 is caused by an accumulation of dimensional tolerance of a large number of parts forming the electronic circuit unit 1. Hence, the gap is provided based on a difference between the dimensional tolerances of the guide hole forming parts 110 and the guide pins 70.

More particularly, as shown in FIG. 7-(C), the positioning part 70-1 of the guide pin 70 has a cross section wherein an arc of an external circumference is made wherein the center is shifted from the center of an external circumference of the guide hole forming part 110 by a distance b, and the radius is the same as the radius of an external circumference of the guide hole forming part 110 or smaller than the external circumference of the guide hole forming part 110 by x.

Accordingly, the movable distance in upper and lower directions (Z1–Z2 direction) in the guide hole forming part 110, is always constant at any point of the external circumference of the positioning part 70-1 of the guide pin 70. That is, the movable distance is a length b in the upper and lower directions (Z1–Z2 direction). Therefore, the electronic circuit unit 1 can be moved in the upper and lower directions (Z1–Z2 direction) against the shelf 100. Because of this, the measurement errors of the distance between the guide hole forming parts 110 positioned at the upper and lower parts of the shelf 100 and the measurement errors of the distance between the guide pins 70 positioned at the upper and lower parts of the electronic circuit unit 1, can be negated.

The guide part 70-2 has a head end part having a tapering configuration. Because of this, the guide pin 70 can be guided into the guide hole forming part 110 by the guide part 70-2.

Since the guide pin 70 has the above mentioned configuration, it is not necessary to make the guide hole having a cross section of an ellipse that is difficult to be formed. Rather, it is possible to easily make the guide hole forming part 110 having a cross section of a circle that is easy to be formed, so that the shelf 100 can be made easily.

Next, structure of the lever 30, and the housing part 31 and the cover part 32 that sandwich the lever 30, will be described.

Figure 8:
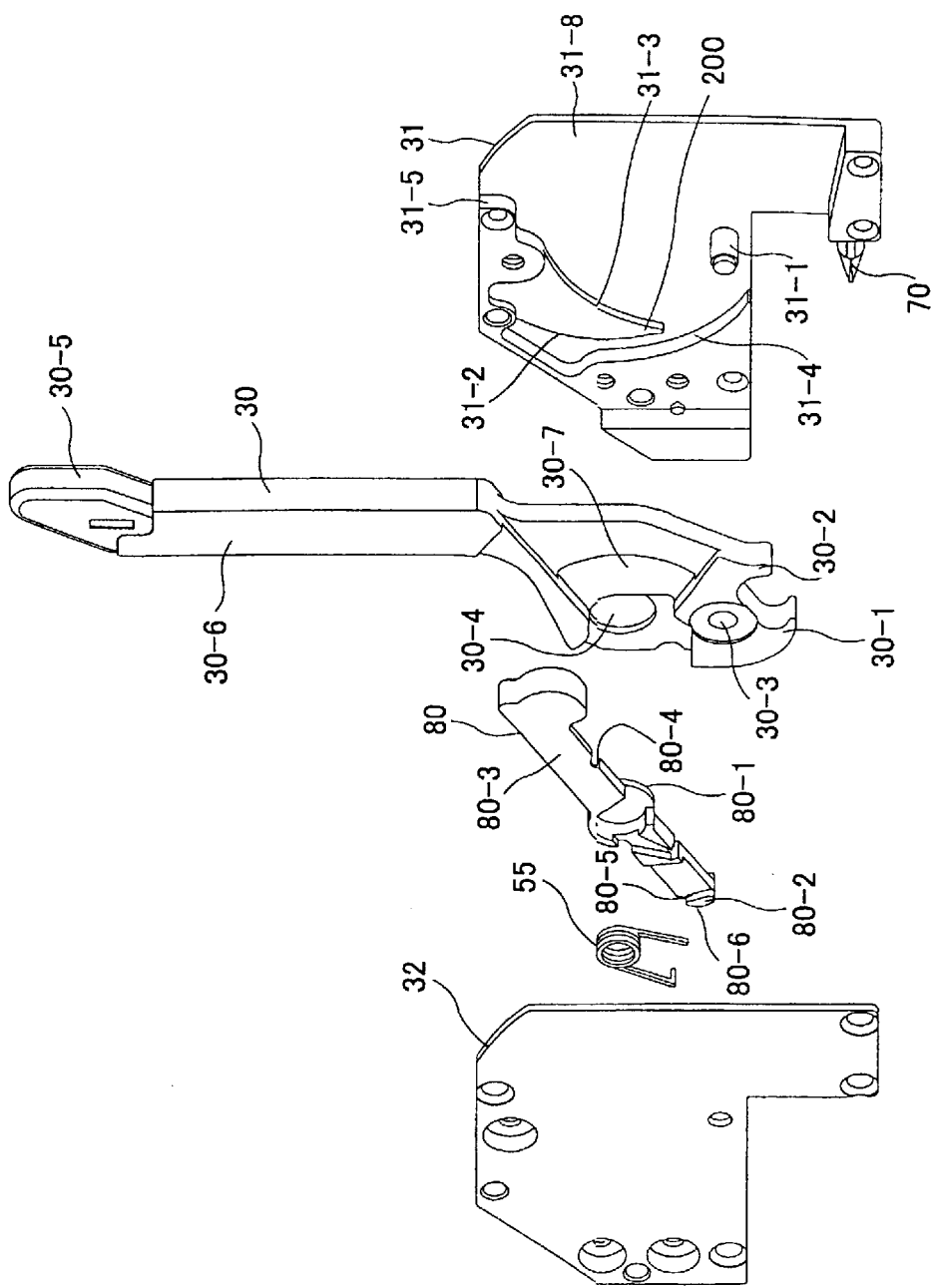
FIG. 8 is an exploded perspective view of the lever 30 for inserting and removing, the cover part 32 and others, provided at the lower part of the electronic circuit unit 1, shown and seen from a Y1 side to a Y2 side in FIG. 5-(A)
Figure 9:
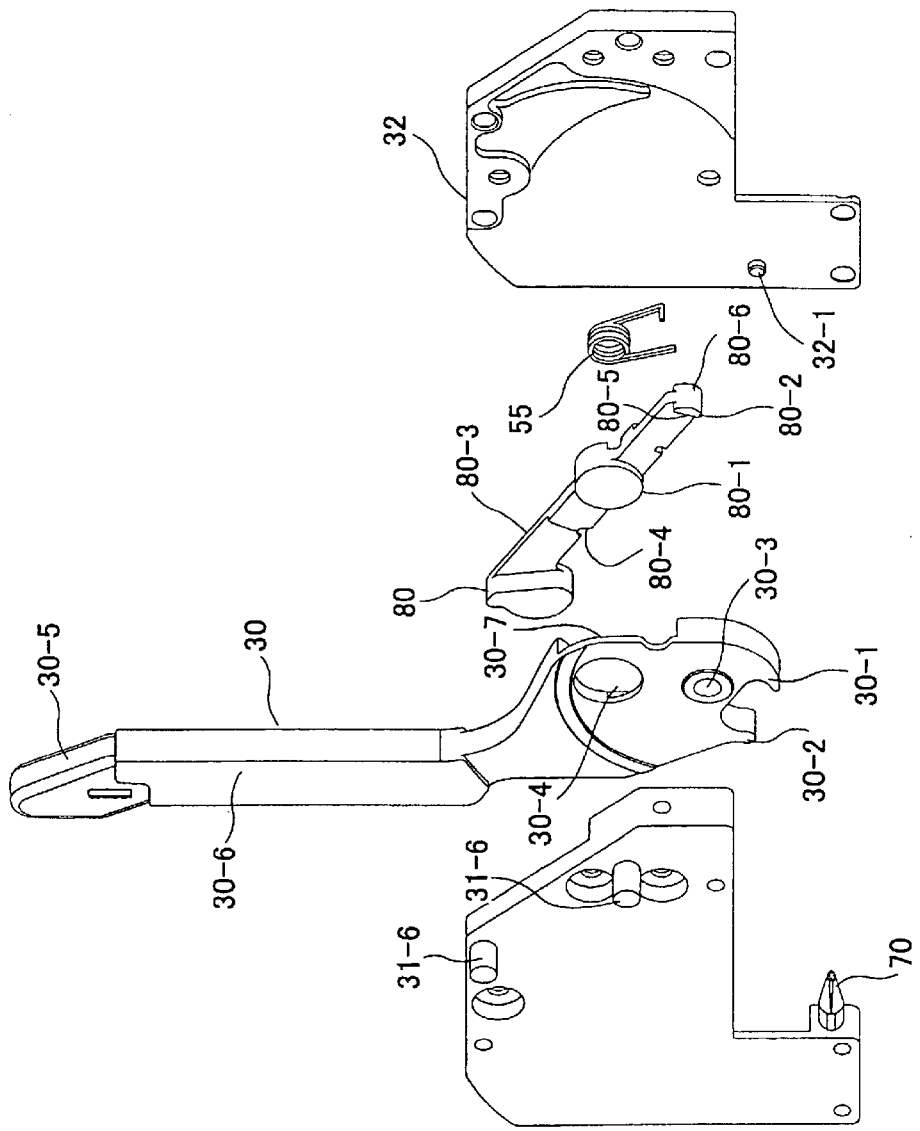
FIG. 9 is an exploded perspective view of the lever 30 for inserting and removing, the housing part 31 and others, provided at the lower part of the electronic circuit unit 1, shown and seen from a Y1 side to a Y2 side in FIG. 5-(B)

FIG. 8 is an exploded perspective view of the lever 30 for inserting and removing, the cover part 32 and others, provided at the lower part of the electronic circuit unit 1, shown and seen from a Y1 side to a Y2 side in FIG. 5-(A). FIG. 9 is an exploded perspective view of the lever 30 for inserting and removing, the housing part 31 and others, provided at the lower part of the electronic circuit unit 1, shown and seen from a Y1 side to a Y2 side in FIG. 5-(B). Accordingly, the lever 30 for inserting and removing, the housing part 31 and the cover part 32 shown in FIGS. 8 and 9 are provided at the lower part of the electronic circuit unit 1.

Referring to FIGS. 8 and 9, the lever 30 for inserting and removing consists of a fixing part 30-1, a claw part 30-2, an operation part 30-5, an arm part 30-6, and others.

The fixing part 30-1 comes in contact with an inside part of the projection part 109 (shown in FIG. 6) of the front frame 106 of the shelf 100, when the electronic circuit unit 1 is inserted into the shelf 100, and then the electronic circuit unit 1 is fixed by the fixing part 30-1.

The claw part 30-2 comes in contact with an outside part of the projection part 109 of the shelf 100 when the electronic circuit unit 1 is pulled from the shelf 100. The electronic circuit unit 1 can be pulled from the shelf 100 by applying the leverage wherein the contact position is a fulcrum.

The operation part 30-5 for operating the arm part 30-6 is provided at an end part of the lever 30 for inserting and removing. A rotation center part 30-3 is provided at an opposite side to the side where the operation part 30-5 is situated. Therefore, an operator can operate the operation part 30-5 manually, and thereby the arm part 30-6 can rotate in a state where the rotation center part 30-3 is the center of the rotation of the arm part 30-6.

A rotation center part 30-4 of a stopper 80 described below is provided right over the rotation center part 30-3 of the arm part 30-6. Furthermore, a side surface of the stopper 80 forms the same surface as a side surface of the lever 30 for inserting and removing. A groove forming part 30-7 is formed on the side surface of the lever 30 for inserting and removing so as to rotate the stopper 80.

Next, the stopper 80 will be described.

A rotation center part 80-1 is provided at a designated part of the arm part 80-3 of the stopper 80. A spring 55 is housed in the rotation center part 80-1. The stopper 80 is provided to the lever 30 for inserting and removing, so that the rotation center part 80-1 coincides with the rotation center part 30-4 of the stopper 80 provided in the lever 30 for inserting and removing. A force is applied in a rotating direction of the spring 55. Therefore, the lever 30 for inserting and removing and the stopper 80 can be rotated by the spring 55. Although the spring 55 is used in this specification as an embodiment of the present invention, other kinds of elastic bodies may be used having the same function as the spring 55.

An engaging part 80-2 projects from the end part of the arm part 80-3 to the sides of the housing part 31 and the cover part 32 so as to extend like a projection. The engaging part 80-2 has an inside surface 80-5 that is a surface at a side of the rotation center part 80-1 and an outside surface 80-6 that is an opposite side surface to the inside surface 80-5.

A groove forming part 80-4 is formed at an opposite side to the engaging part 80-2 from a position of the rotation center part 80-1 of the arm part 80-3. The stopper 80 is fixed by meshing the groove forming part 80-4 with a projection part 32-1 (described later) of the cover part 32.

Next, the housing part 31 and the cover part 32 that sandwich the lever 30 for inserting and removing and the stopper 80 will be explained.

Referring to FIG. 8, the housing part 31 has a plate structure. A lower level part 31-8 is formed so that the stopper 80 can rotate on the housing part 31. At a lower part of the lower level part 31-8, a rotation axis 31-1 for allowing the lever 30 to be rotated extends from the lower level part 31-8 to the side of the lever 30. Therefore, the rotation center part 30-3 of the lever 30 is provided at the rotation axis 31-1. Furthermore, a rotation stopping part 31-5 for stopping the rotation of the lever 30, that contacts with the arm part 30-6 of the lever 30, is formed at a upper part of the housing part 31.

An insertion guide surface 31-3 and an engaging surface 31-2 are provided at a vicinity of the rotation stopping part 31-5 of the lever 30. The outside surface 80-6 of the engaging part 80-2 of the stopper 80 is guided by the insertion guide surface 31-3 when the electronic circuit unit 1 is inserted to the shelf 100. The engaging surface 31-2 engages with the inside surface 80-5 of the engaging part 80-2 of the stopper 80. The engaging surface 31-2 and the insertion guide surface 31-3 form an acute angle part 200.

In addition, an engaging lifting guide surface 31-4 is provided at the back of the engaging surface 31-2. When the electronic circuit unit 1 is pulled out, the engagement of the inside surface 80-5 of the engaging part 80-2 of the stopper 80 is lifted. The outside surface 80-6 of the engaging part 80-2 of the stopper 80 is guided by the engaging lifting guide surface 31-4 until the operator pulls the lever 30 forward.

As shown in FIG. 9, pins 31-6 extend from a surface outside of the housing 31. The housing part 31 sandwiching the lever 30 and others with the cover part 32 can be provided to the surface board 50 by the pins 31-6. As described above, FIGS. 8 and 9 show a case where the lever 30 is provided at the lower part of the electronic circuit unit 1. However, in a case where the lever 30 is provided at the upper part of the electronic circuit unit 1, the pins 31-6 are not provided on the surface of outside of the housing 31, but pins extend from a surface outside of the cover part 32 so that the cover part 32 can be provided to the surface board 50.

Referring to FIG. 9, the cover part 32 has a substantially same structure as the housing part 31. However, the projection part 32-1, projecting to an inside (a side of the lever 30) of the cover part 32, is provided at a lower side of the surface of the inside (the side of the lever 30) of the cover part 32. The projection part 32-1 has two functions. One is to guide the outside surface 80-6 of the engaging part 80-2 of the stopper 80 to the insertion guide surface 31-3 of the housing part 31. The other is to engage the groove forming part 80-4 of the stopper 80 in a state where the lever 30 is rotated counterclockwise so that the stopper can be fixed.

Figure 10:
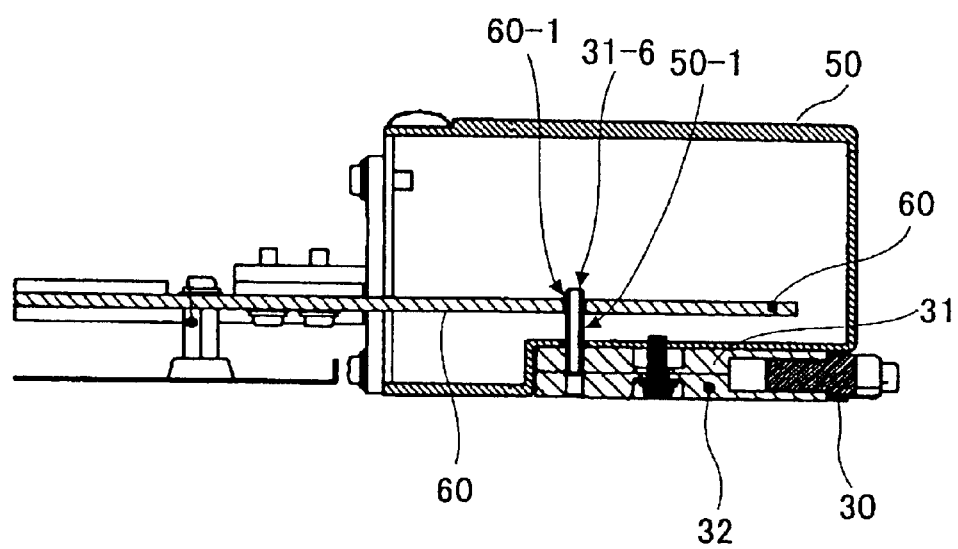
FIG. 10 is a cross-sectional view taken on the plane A—A of FIG. 5-(A) with regard to the housing part 31, the cover part 32, the lever 30, the electronic circuit board 60 and others that are provided to the surface board 50 provided at the lower part of the electronic circuit unit 1.

FIG. 10 is a cross-sectional view taken on the plane A—A of FIG. 5-(A) with regard to the housing part 31, the cover part 32, and the lever 30, the electronic circuit board 60 and others that are provided to the surface board 50 provided at the lower part of the electronic circuit unit 1.

Referring to FIG. 10, a positioning hole forming part 60-1 is provided on the electronic circuit board 60 shown in FIG. 5. A piercing hole forming part 50-1 where the pin 31-6 of the housing part 31 pierces is provided on the surface board 50. Under the above mentioned structure, the pin 31-6 pierces into the surface board 50 and the electronic circuit board 60 through the piercing hole forming part 50-1 and the positioning hole forming part 60-1. Therefore, it is possible to assemble the electronic circuit board 60 and the lever 30 after the positioning relationship of the electronic circuit board 60 and the lever 30 is determined securely. Furthermore, it is possible to make the measurement error between the connector part 40 and the fixing part 30-1 of the lever 30 small.

In the meantime, the present invention is not limited to the embodiment shown in FIG. 5. Rather, the present invention may be applied to an embodiment shown in FIG. 11. That is, FIG. 11 is a view of an exterior of a modified example of the electronic circuit unit 1 wherein the levers 30 for inserting and removing are provided at upper and lower parts of the electronic circuit unit 1.

Figure 11:
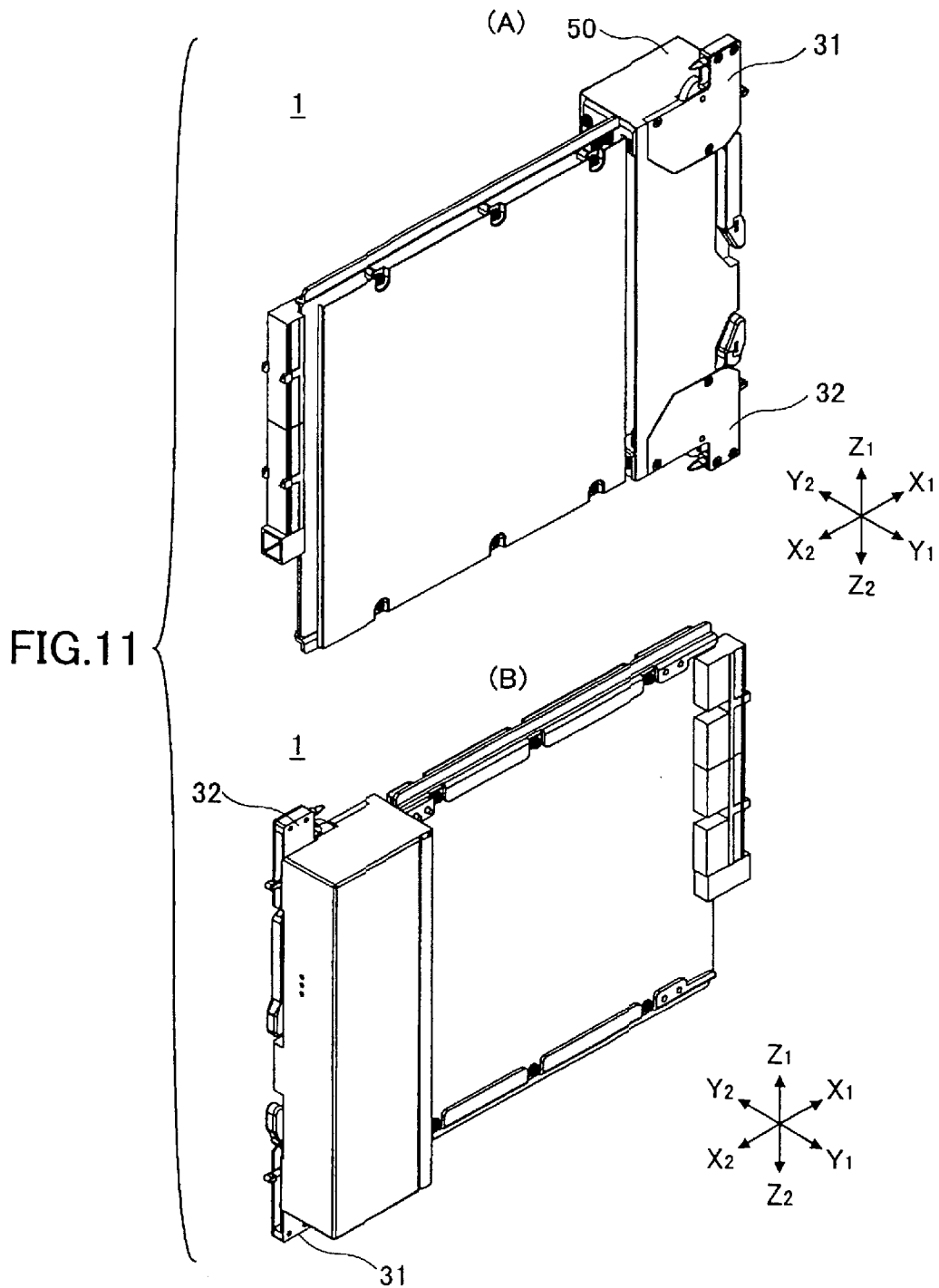
FIG. 11 is a view of an exterior of a modified example of the electronic circuit unit 1 wherein the levers 30 for inserting and removing are provided at upper and lower parts of the electronic circuit unit 1.

Referring to FIG. 11, in this modified example, the surface board 50 of the electronic circuit unit 1 and the housing part 31 of the lever 30 are formed in a body, and thereby it is possible to make the width in Y1–Y2 direction of the electronic circuit unit 1 short. Furthermore, it is possible to reduced the number of parts forming the electronic circuit unit 1 so that it is possible to contribute to reduce manufacturing costs of the electronic circuit unit 1. In addition, it is possible to make the surface board 50 easily by die casting.

Next, a mechanism for inserting and removing electronic circuit unit 1 having the above mentioned structure will be described.

FIGS. 12–32 show a mechanism of the lever 30 provided at the lower part of the electronic circuit unit 1. The lever 30 inserts into and moves against the front frame 106. Since the lever 30 provided at the upper part has substantially same mechanism, explanation thereof will be omitted.

Figure 12:
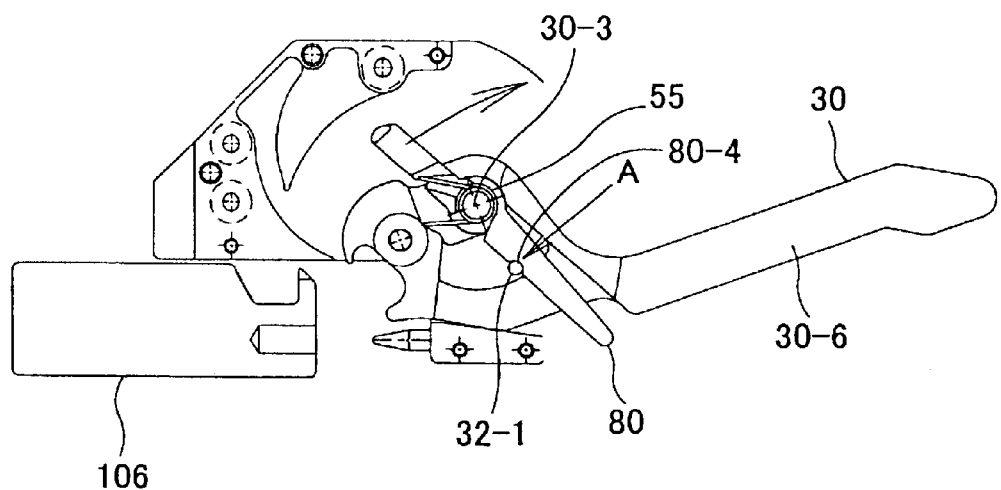
FIG. 12 is a view showing a state prior to where the electronic circuit unit 1 is inserted to the shelf 100.

FIG. 12 is a view showing a state prior to where the electronic circuit unit 1 is inserted to the shelf 100. The spring 55 and the stopper 80 rotated by the spring 55 are provided at the lever 30. One end of the spring 55 is connected to the rotation center part 30-3 of the arm part 30-6 of the lever 30. The lever 30 is rotated clockwise. The stopper 80 receives a force to be rotated clockwise by a force of the spring 55. The groove forming part 80-4 of the stopper 80 engages with the projection part 32-1 of the cover part 32, so that the stopper 80 is fixed. If the cover part 32 does not have the projection part 32-1, the stopper 80 is rotated clockwise and the lever 30 is rotated counterclockwise by the force of the spring 55. However, the projection part 32-1 is provided at the housing part 32 in the present invention. Accordingly, the stopper 80 is fixed by engaging the groove forming part 80-4 and the projection part 32-1.

Figure 13:
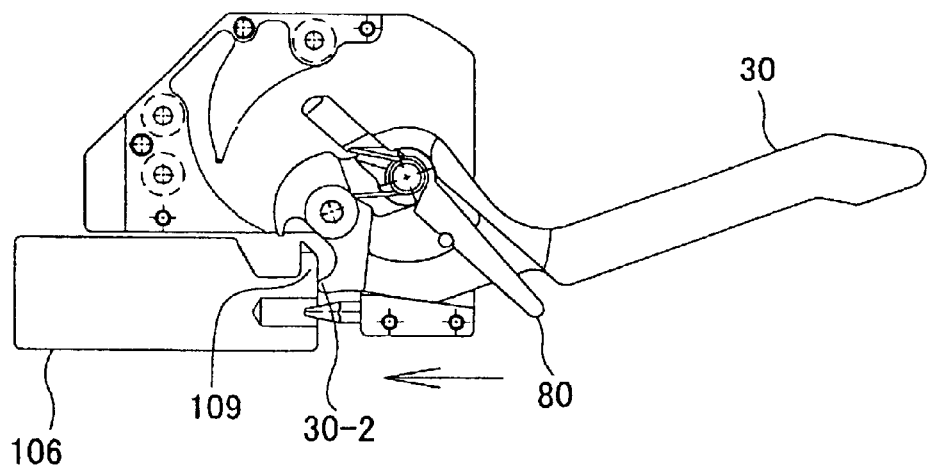
FIG. 13 is a view showing a state where the electronic circuit unit 1 starts being inserted to the shelf 100.

FIG. 13 is a view showing a state where the electronic circuit unit 1 starts being inserted to the shelf 100. The claw part 30-2 of the lever 30 comes in contact with a front surface of the projection part 109 of the front frame 106.

Figure 14:
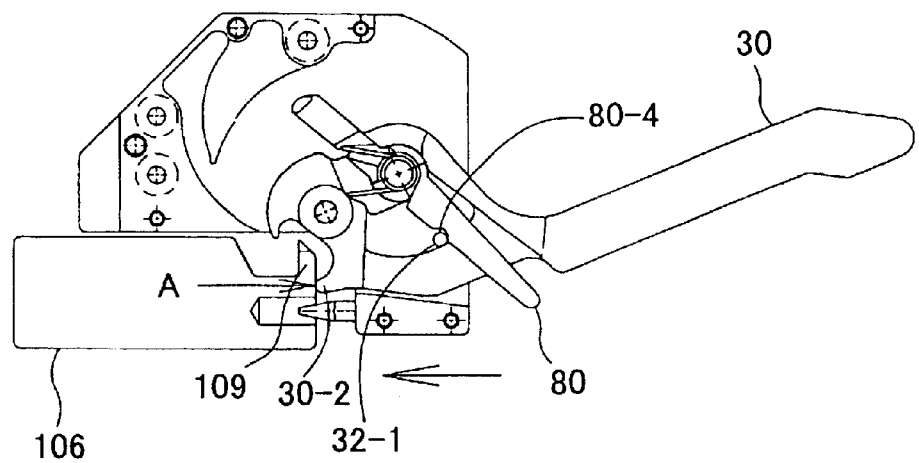
FIG. 14 is a view showing a state where the electronic circuit unit 1 is further inserted to the shelf 100.

FIG. 14 is a view showing a state where the electronic circuit unit 1 is further inserted to the shelf 100. In this state, the lever 30 does not move because of an engagement of the groove forming part 80-4 and the projection part 32-1. However, since more forces is applied from an arrow A direction to the claw part 30-2 of the lever 30 coming contact with the front surface of the projection part 109 of the front frame 106, the lever 30 is rotated a little and counterclockwise, so that the engagement of the groove forming part 80-4 and the projection part 32-1 is off, as shown in FIG. 15.

Figure 15:
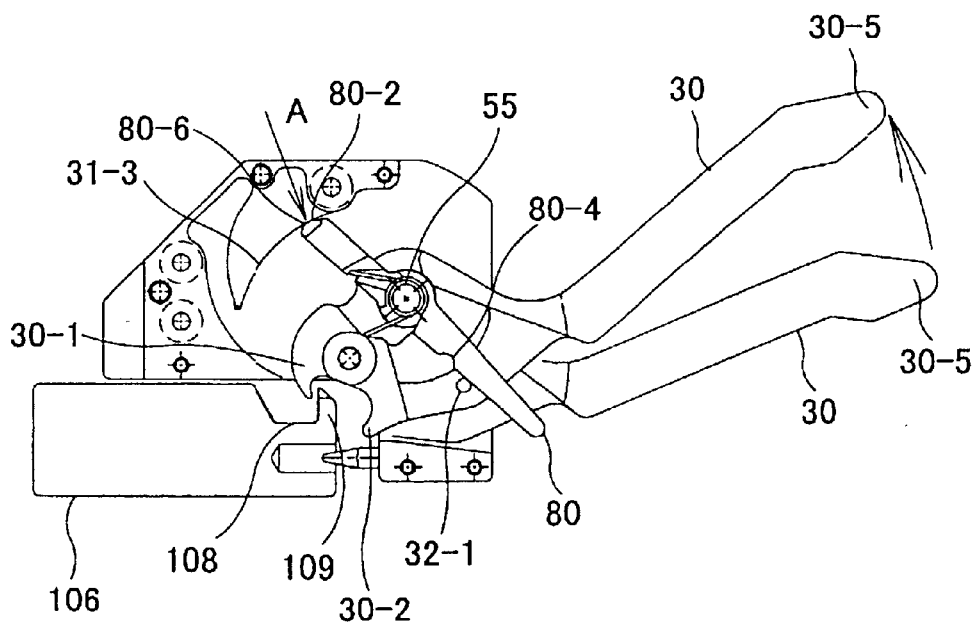
FIG. 15 is a view showing a state where the lever 30 is rotated counterclockwise, so that the engagement of the groove forming part 80-4 and the projection part 32-1 is off simultaneously.

As shown in FIG. 15, based on that the engagement of the groove forming part 80-4 and the projection part 32-1 being off, the lever 30 is rotated counterclockwise some amount by the force of the spring 55. On the other hand, a force rotating the stopper 80 clockwise by the spring 55 is applied to the stopper 80. Because of this, after the engagement of the groove forming part 80-4 and the projection part 32-1 is off, the stopper 80 slides on the projection part 32-1, and thereby the engaging part 80-2 of the stopper 80 moves in the direction of the insertion guide surface 31-3. However, since the stopper 80 comes in contact with the projection part 32-1, the stopper 80 cannot move at all after the outside surface 80-6 of the engaging part 80-2 of the stopper 80 comes in contact with a highest end (shown by the arrow A in FIG. 15) of the insertion guide surface 31-3 of the housing part 31.

If the projection part is not provided at the housing part 32, the outside surface 80-6 of the engaging part 80-2 of the stopper 80 comes in contact with a surface situated at a side further right than the highest end (shown by the arrow A in FIG. 15) of the insertion guide surface 31-3. Here, the highest end is situated at a limiting position where the stopper 80 can be guided by the insertion guide surface 31-3. As a result of this, the stopper 80 cannot be slid even if the operator operates the stopper. However, the outside surface 80-6 of the engaging part 80-2 of the stopper 80 is stopped moving at the highest end of the insertion guide surface 31-3 by the projection part 32-1, so that the above mentioned problem can be avoided. That is, the projection part 32-1 is positioned so that the outside surface 80-6 of the engaging part 80-2 of the stopper 80 is stopped at the highest end of the insertion guide surface 31-3.

In a state shown in FIG. 15, the fixing part 30-1 of the lever 30 is situated in the groove forming part 108 located at an inside of the projection part 109 of the front frame 106. Furthermore, the operator can easily see by rotating the operation part 30-5 of the lever 30 with an operator's finger that lock operation is ready to start, based on the lever 30 being rotated counterclockwise some amount by the force of the spring 55.

Figure 16:
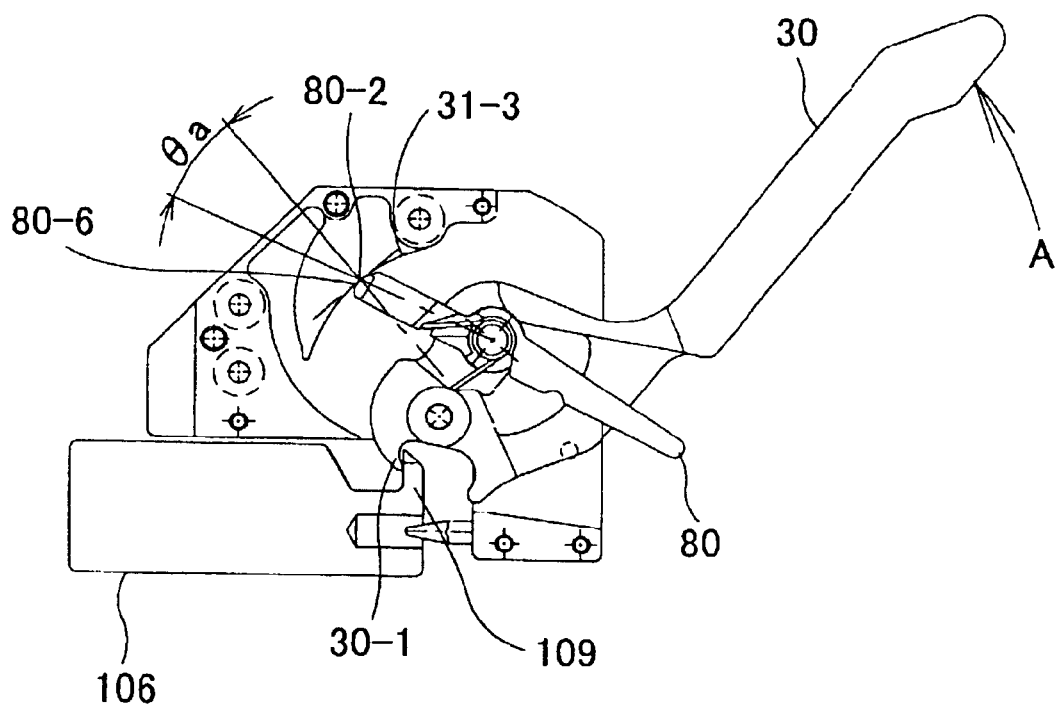
FIG. 16 is a view showing a state where the electronic circuit unit 1 is further inserted to the shelf 100 by leverage, following the state shown in FIG. 15.

FIG. 16 is a view showing a state where the electronic circuit unit 1 is further inserted to the shelf 100 by leverage from the state shown in FIG. 15. The fixing part 30-1 of the lever 30 comes in contact with the inside of the projection part 109 of the front frame 106. The outside surface 80-6 of the engaging part 80-2 of the stopper 80 is slid on the insertion guide surface 31-3. Here, the outside surface 80-6 of the engaging part 80-2 of the stopper 80 is coated with a lubricating material, Teflon (registered trade mark) coating, or the like, so that the outside surface 80-6 is easy to slide.

Figure 17:
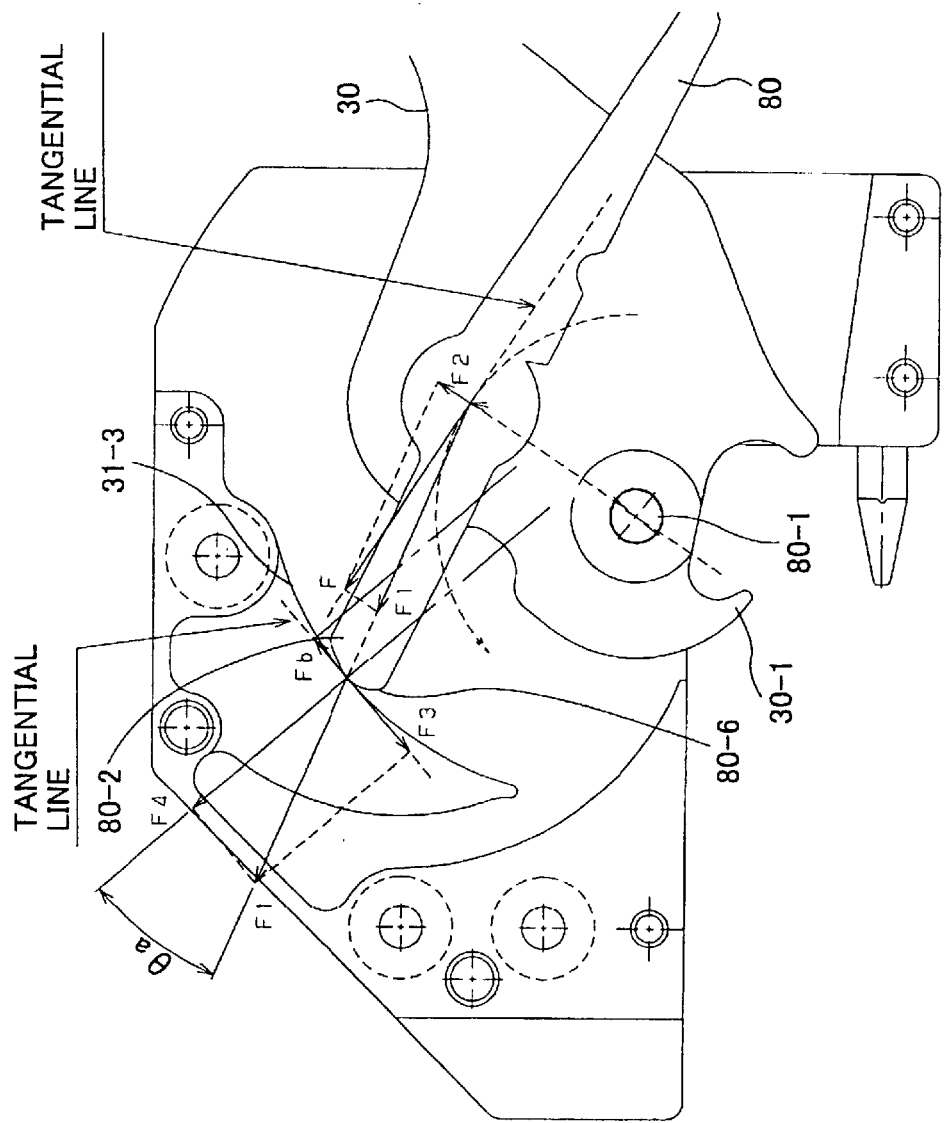
FIG. 17 is a view showing a principle wherein the engaging part 80-2 of the stopper 80 is slid on the insertion guide surface 31-3 in the state shown in FIG. 16.

FIG. 17 is a view showing a principle wherein the engaging part 80-2 of the stopper 80 is slid on the insertion guide surface 31-3 in the state shown in FIG. 16. Referring to FIG. 17, the lever 30 is rotated counterclockwise as shown by a dotted arrow A in FIG. 16. A force F is generated in the direction of a line tangential to the rotation of the rotation center part 80-1 of the stopper 80. The force F can be resolved into a force F1 and a force F2.

The force F1 is a force in the direction of a point where the engaging part 80-2 of the stopper 80 comes in contact with the insertion guide surface 31-3. The force F1 is applied to the insertion guide surface 31-3. A reaction force of the spring 55 occurs by operating the lever 30 manually so as to rotate the lever 30 counterclockwise. The force F1 occurs based on the reaction force of the spring 55 so that the insertion guide surface 31-3 is pushed by the stopper 80. As shown in FIG. 17, the force F1 is resolved into a force F3 and a force F4.

The force F3 is a force in a direction of a tangential line at a position of the insertion guide surface 31-3 that is a curved surface where the outside surface 80-6 of the engaging part 80-2 of the stopper 80 comes in contact. That is, the force F3 is expressed as $F3=F1\times\sin\theta_a$. The force F4 is a force in a right-angled direction against the tangential line at a position of the insertion guide surface 31-3 that is a curved surface where the outside surface 80-6 of the engaging part 80-2 of the stopper 80 comes in contact. That is, the force F4 is expressed as $F4=F1\times\cos\theta_a$. In this case, in a case of $F3>F4\times\mu_0+F_b$, the outside surface 80-6 of the engaging part 80-2 of the stopper 80 slides on the insertion guide surface 31-3, wherein a friction coefficient of the insertion guide surface 31-3 where the outside surface 80-6 of the engaging part 80-2 of the stopper 80 comes in contact is defined as $\mu_0$ and the force generated at the insertion guide surface 31-3 by the spring 55 is defined as $F_b$.

Under the above mentioned principle, the outside surface 80-6 of the engaging part 80-2 of the stopper 80 and the insertion guide surface 31-3 are set as having a slidable angle $\theta_a$, more than 20 degrees, for example. Thus, the engaging part 80-2 of the stopper 80 is slid on the insertion guide surface 31-3 while pushing against the insertion guide surface 31-3.

Figure 18:
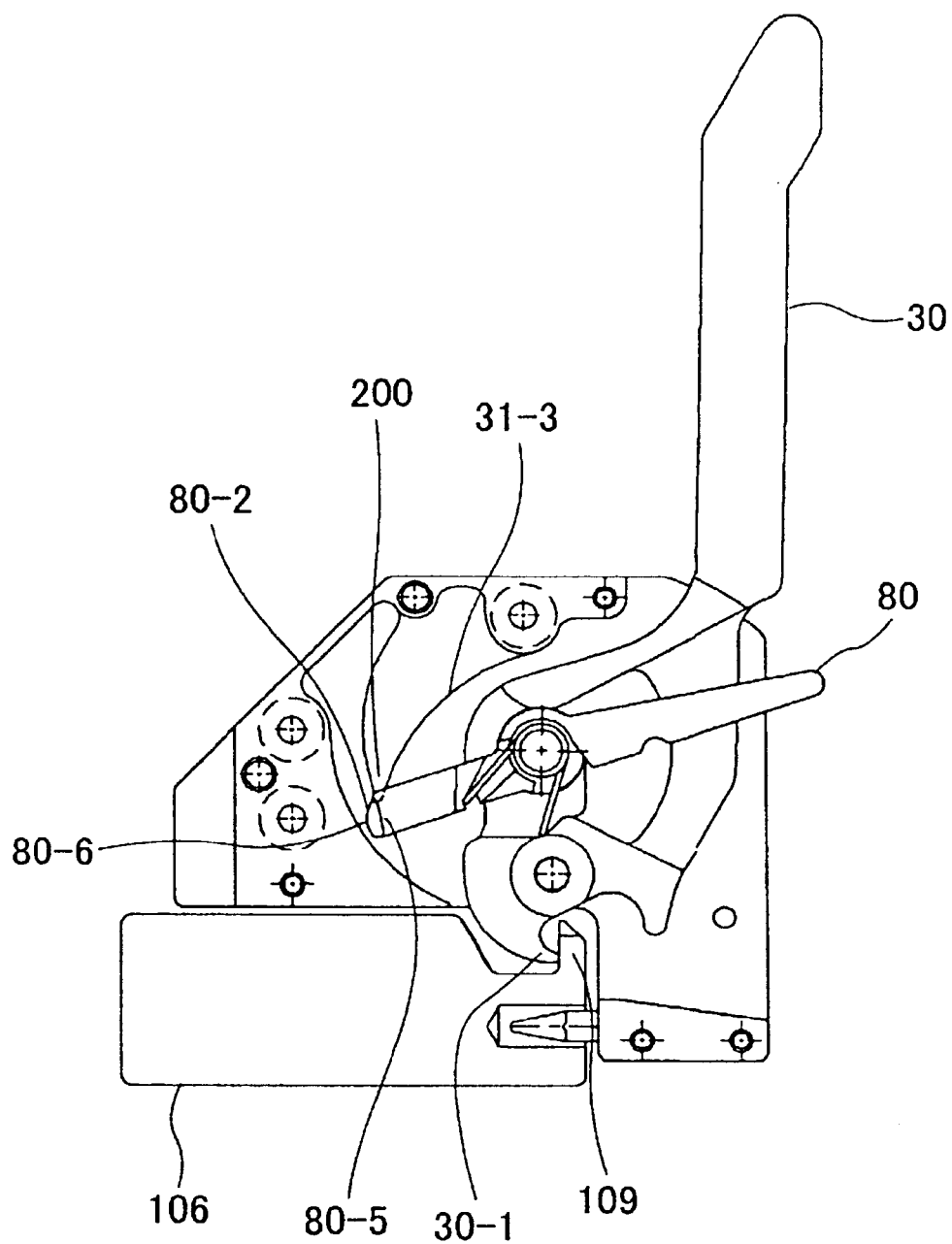
FIG. 18 is a view showing a state where the engaging part 80-2 of the stopper 80 is further slid on the insertion guide surface 31-3 beneath from a state shown in FIGS. 16 and 17, so that the outside surface 80-6 of the engaging part 80-2 of the stopper 80 is positioned at an acute angle to part 200 that is a lower end part of the insertion guide surface 31-3.

FIG. 18 is a view showing a state where the engaging part 80-2 of the stopper 80 is further slid on the insertion guide surface 31-3 from a state shown in FIGS. 16 and 17, so that the outside surface 80-6 of the engaging part 80-2 of the stopper 80 is positioned at the acute angle part 200 that is a lower end of the insertion guide surface 31-3.

Figure 19:
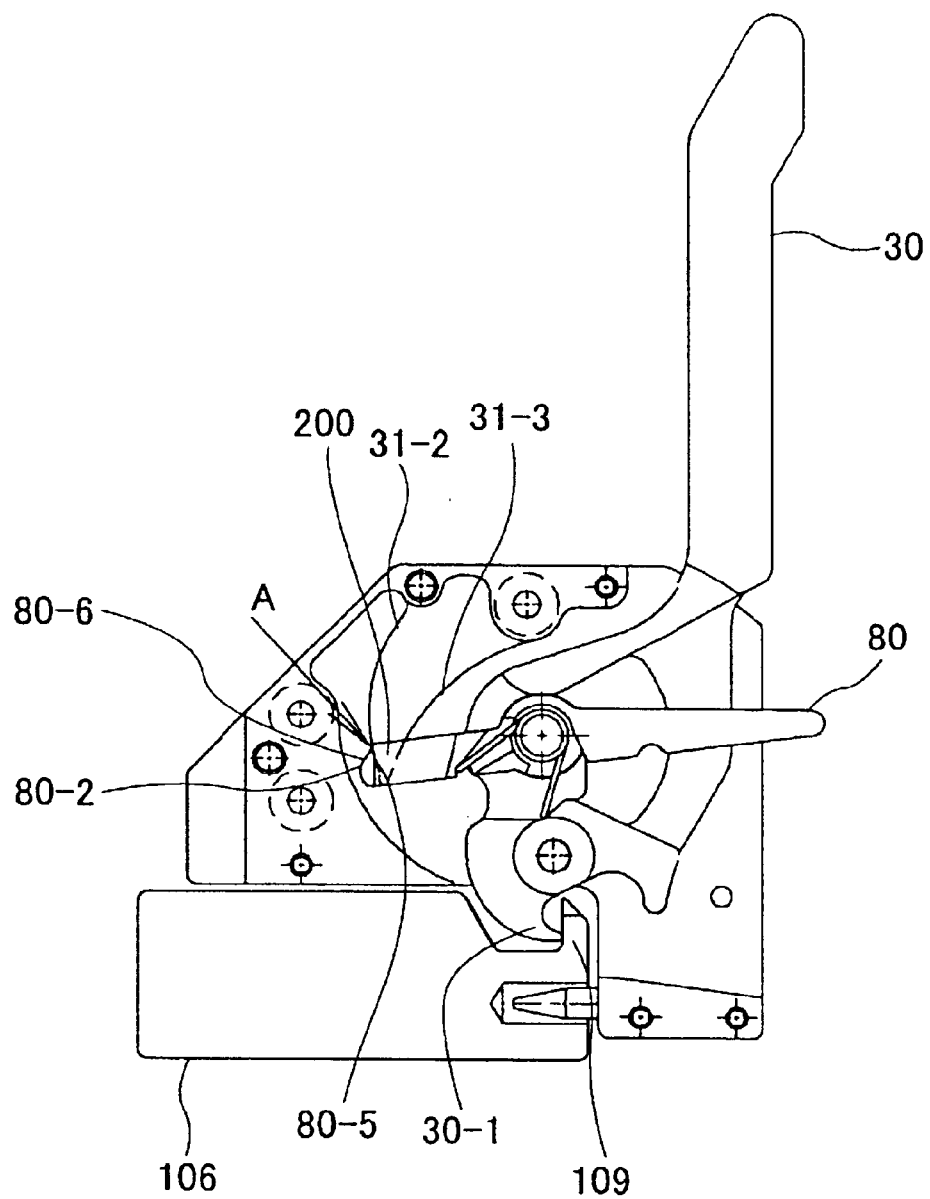
FIG. 19 is a view showing a state where outside surface 80-6 of the engaging part 80-2 of the stopper 80 passes through the acute angle part 200 that is a lower end part of the insertion guide surface 31-3, so that the inside surface 80-5 of the engaging part 80-2 of the stopper 80 comes in contact with the engaging surface 31-2.

FIG. 19 is a view showing a state where outside surface 80-6 of the engaging part 80-2 of the stopper 80 passes by the acute angle part 200 that is a lower end part of the insertion guide surface 31-3, so that the inside surface 80-5 of the engaging part 80-2 of the stopper 80 comes in contact with the engaging surface 31-2. The stopper 80 moves some amount from a state shown in FIG. 18 to a state shown in FIG. 19 due to the force of the spring 55.

Figure 20:
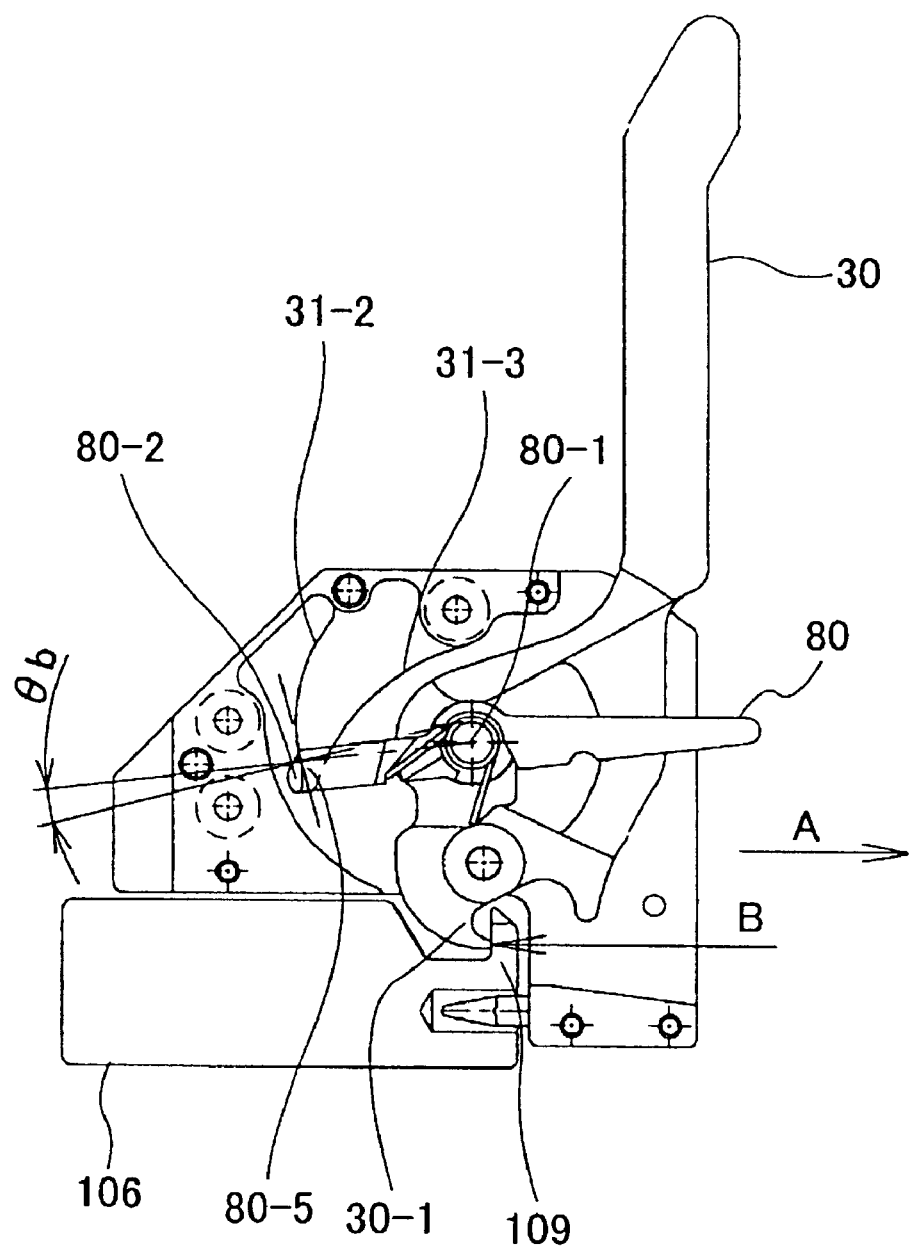
FIG. 20 is a view showing a state as a result of the lever 30 being rotated clockwise or a force (in the direction of the arrow A in FIG. 20) pulling out the electronic circuit unit 1 by vibration or the like being applied to the electronic circuit unit 1 in a state shown in FIG. 19.

FIG. 20 is a view showing a state result of the lever 30 being rotated clockwise or a force (in the direction of the arrow A in FIG. 20) pulling out the electronic circuit unit 1 by vibration or the like being applied to the electronic circuit unit 1 in the state shown in FIG. 19.

In a case where a force pulling out the electronic circuit unit 1 by vibration or the like is applied to the electronic circuit unit 1, a force in a direction of the arrow B is applied from an inside of the projection part 109 of the front frame 106 to the fixing part 30-1 of the lever 30. In this case, the lever 30 is rotated clockwise, so that the inside surface 80-5 of the engaging part 80-2 of the stopper 80 is pulled in a direction toward the rotation center part 80-1 of the stopper 80. However, the inside surface 80-5 of the engaging part 80-2 of the stopper 80 and the engaging surface 31-2 has an unslidable angle $\theta_b$ described later. Hence, the engaging part 80-2 of the stopper 80 does not slide.

Figure 21:
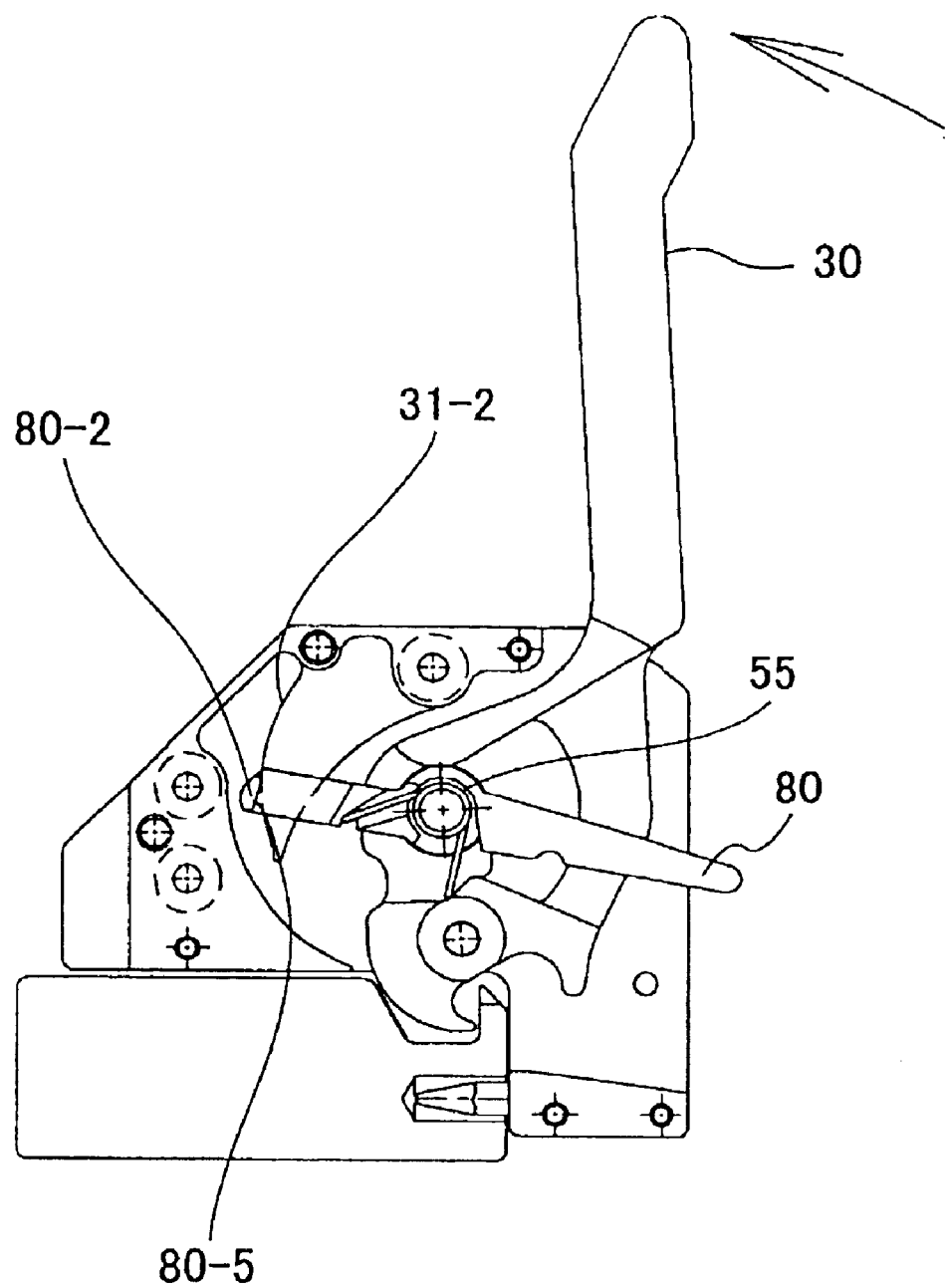
FIG. 21 is a view showing a state where the lever 30 is further rotated counterclockwise from the state shown in FIG. 19 so that the electronic circuit unit 1 is inserted.

FIG. 21 is a view showing a state where the lever 30 is further rotated counterclockwise from a state shown in FIG. 19 so that the electronic circuit unit 1 is inserted. Although the stopper 80 is rotated clockwise by the force of the spring 55, the stopper 80 is locked at a position where an orbit of the engaging part 80-2 of the stopper 80 and the engaging surface 31-2 cross.

Figure 22:
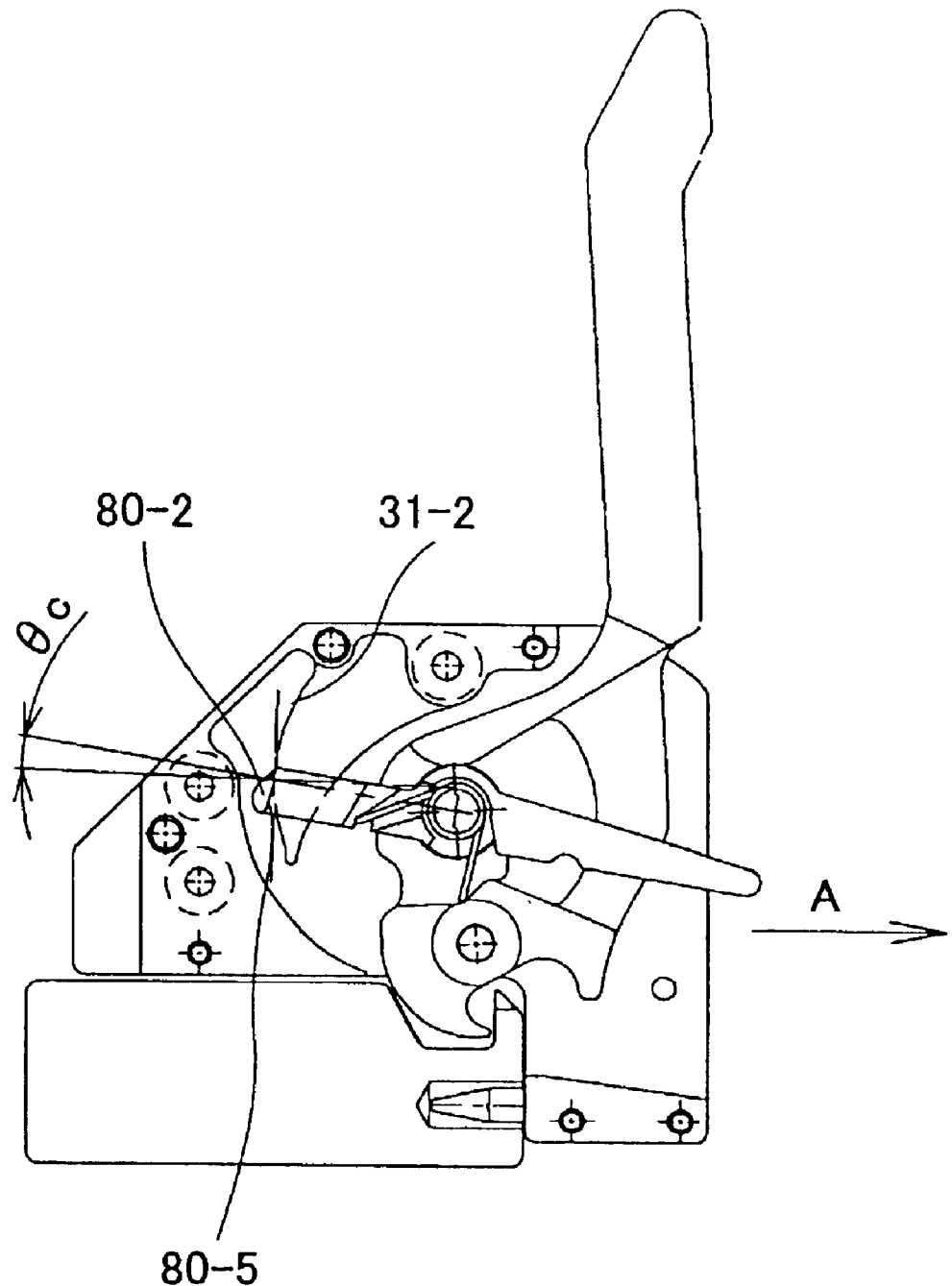
FIG. 22 is a view showing a state as a result of the lever 30 being rotated clockwise or a force (in the direction of the arrow A in FIG. 20) pulling out the electronic circuit unit 1 by vibration or the like being applied to the electronic circuit unit 1 in a state shown in FIG. 21.

FIG. 22 is a view showing a state result of the lever 30 being rotated clockwise or a force (in the direction of the arrow A in FIG. 20) pulling out the electronic circuit unit 1 by the vibration or the like being applied to the electronic circuit unit 1 in the state shown in FIG. 21. In this case, as well as the state shown in FIG. 20, the inside surface 80-5 of the engaging part 80-2 of the stopper 80 and the engaging surface 31-2 have an unslidable angle $\theta_c$. Hence, the inside surface 80-5 of the engaging part 80-2 of the stopper 80 does not slide.

Figure 23:
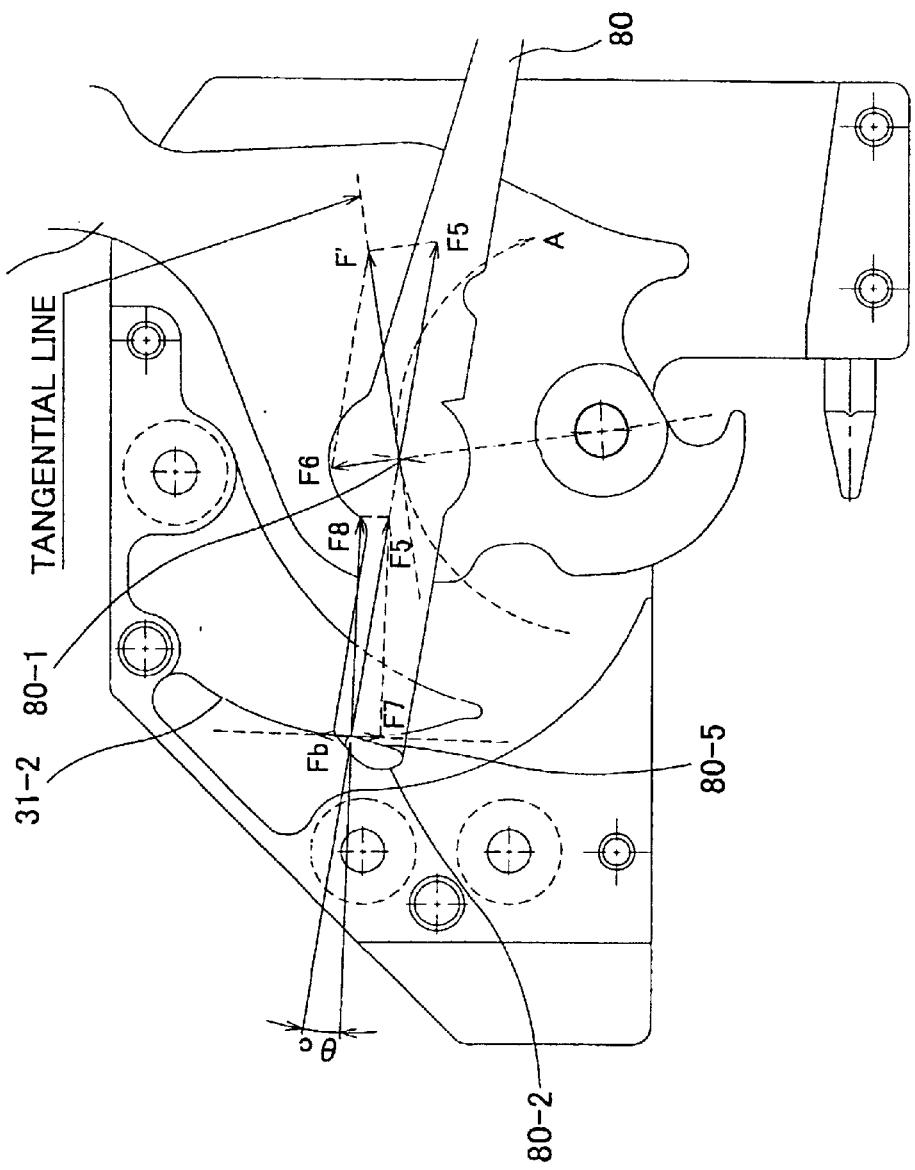
FIG. 23 is a view showing a principle in the state shown in FIG. 22.

FIG. 23 is a view showing a principle in the state shown in FIG. 22. Referring to FIG. 23, the lever 30 is rotated counterclockwise as shown by a dotted arrow A in FIG. 23. A force F' occurs in the direction of a tangential line of a rotation of the rotation center part 80-1 of the stopper 80. The force F' can be resolved into a force F5 and a force F6.

The force F5 is a force in the direction from a point where the engaging part 80-2 of the stopper 80 comes in contact with the insertion guide surface 31-2 to the rotation center part 80-1. Based on the force to pull out the electronic circuit unit 1, the force F5 of the engaging part 80-2 of the stopper 80 is applied to the insertion guide surface 31-2. As shown in FIG. 23, the force F5 is resolved into a force F7 and a force F8.

The force F7 is a force in a direction of a tangential line at a position of the engaging surface 31-2 that is a curved surface where the inside surface 80-5 of the engaging part 80-2 of the stopper 80 comes in contact. That is, the force F7 is expressed as $F7=F5\times\sin\theta_c$. The force F8 is a force in a right-angled direction against the tangential line at a position of the engaging surface 31-2 that is a curved surface where the engaging part 80-2 of the stopper 80 comes in contact. That is, the force F8 is expressed as $F8=F5\times\cos\theta_c$. In this case, in a case of $F7<F8\times\mu_0+F_b$, the inside surface 80-5 of the engaging part 80-2 of the stopper 80 does not slide on the engaging surface 31-2, wherein the friction coefficient of the engaging surface 31-2 where the inside surface 80-5 of the engaging part 80-2 of the stopper 80 comes in contact is defined as $\mu_0$ and the force generated at the engaging surface 31-2 by the spring 55 is defined as $F_b$.

Based on the above mentioned principle, the head end of the stopper 80 and the guide surface 31-2 for lock are set as having an unslidable angle $\theta_c$. This is same as the unslidable angle $\theta_b$.

Figure 24:
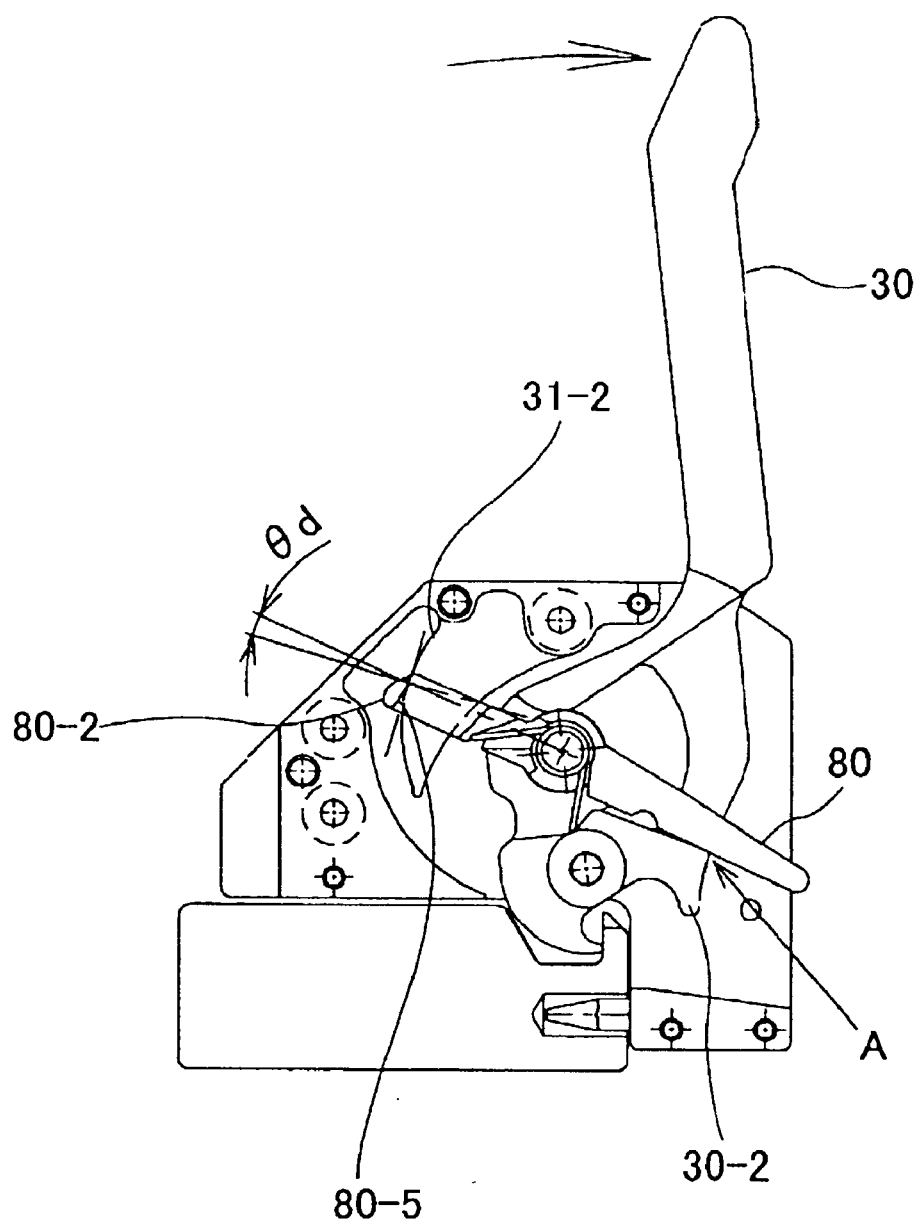
FIG. 24 is a view showing a state where the electronic circuit unit 1 is further inserted, following the state shown in FIG. 21, by rotating the lever 30 counterclockwise.

FIG. 24 is a view showing a state where the electronic circuit unit 1 is further inserted from the state shown in FIG. 21 by rotating the lever 30 counterclockwise.

In this state, the stopper 80 comes in contact with the upper part of the claw part 30-2 that is shown by an arrow A in FIG. 24, so that the stopper 80 cannot be further rotated against the lever 30 clockwise. This is because, even if the lever 30 is further rotated counterclockwise, the inside surface 80-5 of the engaging part 80-2 of the stopper is locked at a position where the orbit of the inside surface 80-5 of the engaging part 80-2 of the stopper 80 and the engaging surface 31-2 cross, so that the stopper 80 cannot be further rotated against the lever 30 clockwise.

In this case, in a case where a force is applied so that the lever 30 is rotated clockwise or a force pulling out the electronic circuit unit 1 by vibration or the like is applied to the electronic circuit unit 1 in the state shown in FIG. 24, the inside surface 80-5 of the engaging part 80-2 of the stopper 80 and the engaging surface 31-2 have an unslidable angle $\theta_d$. Hence, the engaging part 80-2 of the stopper 80 does not slide.

Thus, the electronic circuit unit 1 is inserted and fixed, as shown in FIGS. 19 through 24, by rotating the lever 30 counterclockwise. During states shown in FIGS. 19–24, the inside surface 80-5 of the engaging part 80-2 of the stopper 80 and the engaging surface 31-2 come in contact with each other consecutively. Therefore, even if the engaging part 80-2 of the stopper 80 is pulled in an axial direction of the stopper 80, the inside surface 80-5 of the engaging part 80-2 of the stopper 80 and the engaging surface 31-2 have unslidable angles ($\theta_b$, $\theta_c$, $\theta_d$) and are fixed.

Figure 25:
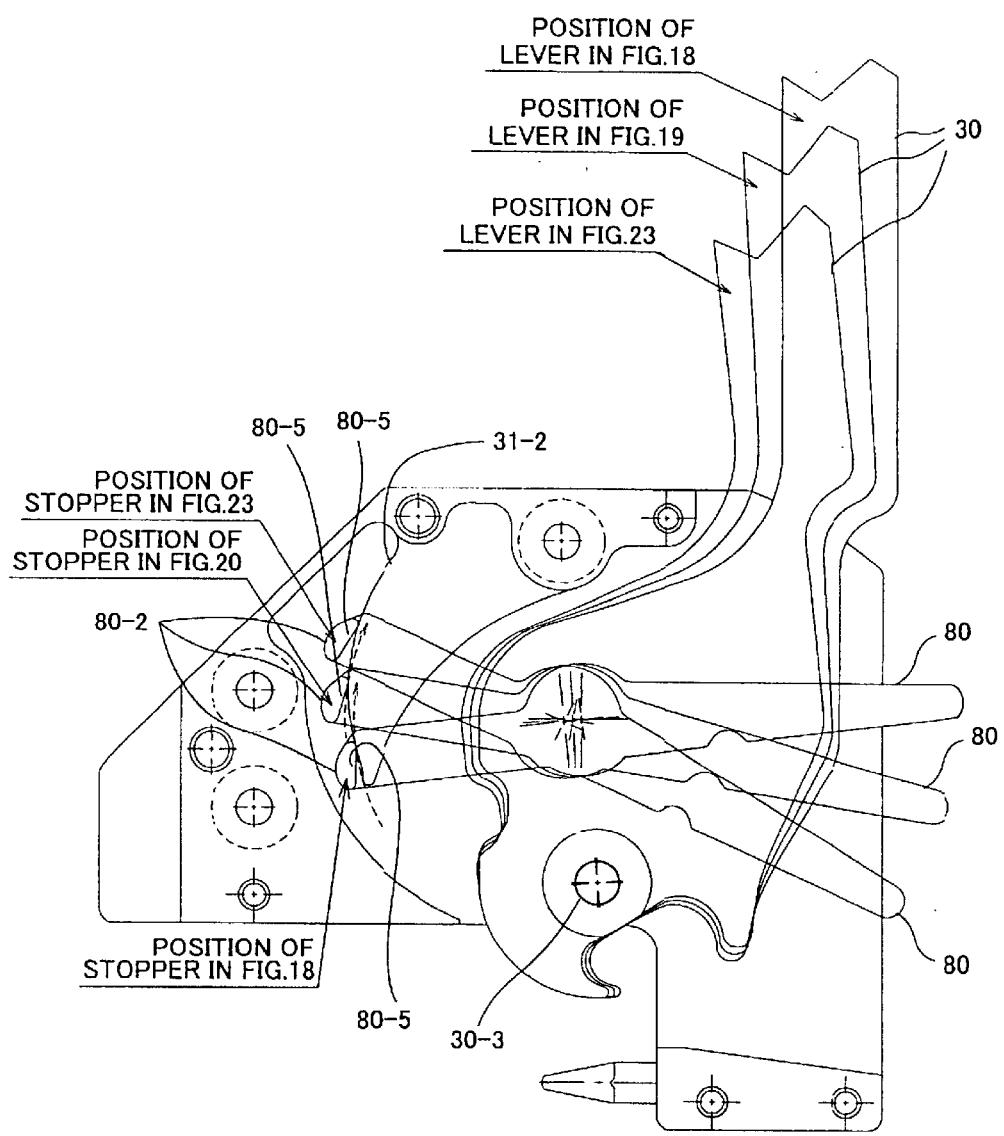
FIG. 25 is a view consecutively showing the lever 30 and the stopper 80 as shown in FIGS. 19, 21, and 24.

FIG. 25 is a view consecutively showing the lever 30 and the stopper 80 shown in FIGS. 19, 21, and 24.

Referring to FIG. 25, the stopper 80 comes in contact and is fixed at the position where the orbit of the engaging part 80-2 of the stopper 80 shown in FIG. 19 crosses with the engaging surface 31-2. The lever 30 is further rotated counterclockwise so that the stopper 80 is also rotated counterclockwise wherein the rotation center part 30-3 of the lever 30 is a center of the rotation. And thereby, a gap is formed between the engaging part 80-2 of the stopper 80 and the engaging surface 31-2. However, the stopper 80 is rotated clockwise by the force of the spring 55 so that the stopper 80 continues coming contact with the engaging surface 31-2. The above mentioned movement of the stopper 80 is consecutive in FIGS. 19, 21 and 24.

According to the engaging surface 31-2 having the above mentioned structure, a lock mechanism not having play between the lever 30 and the front frame 106 can be achieved. That is, even if the fixing part 30-1 of the lever 30 is in the groove forming part 108 of the front frame 106 so that the lever 30 and the front frame 106 are locked, the lever 30 does not have play. Therefore, it is possible to secure the connection between the connector part 40 of the electronic circuit unit 1 and the connector 150 of the back board wiring board 103.

Figure 26:
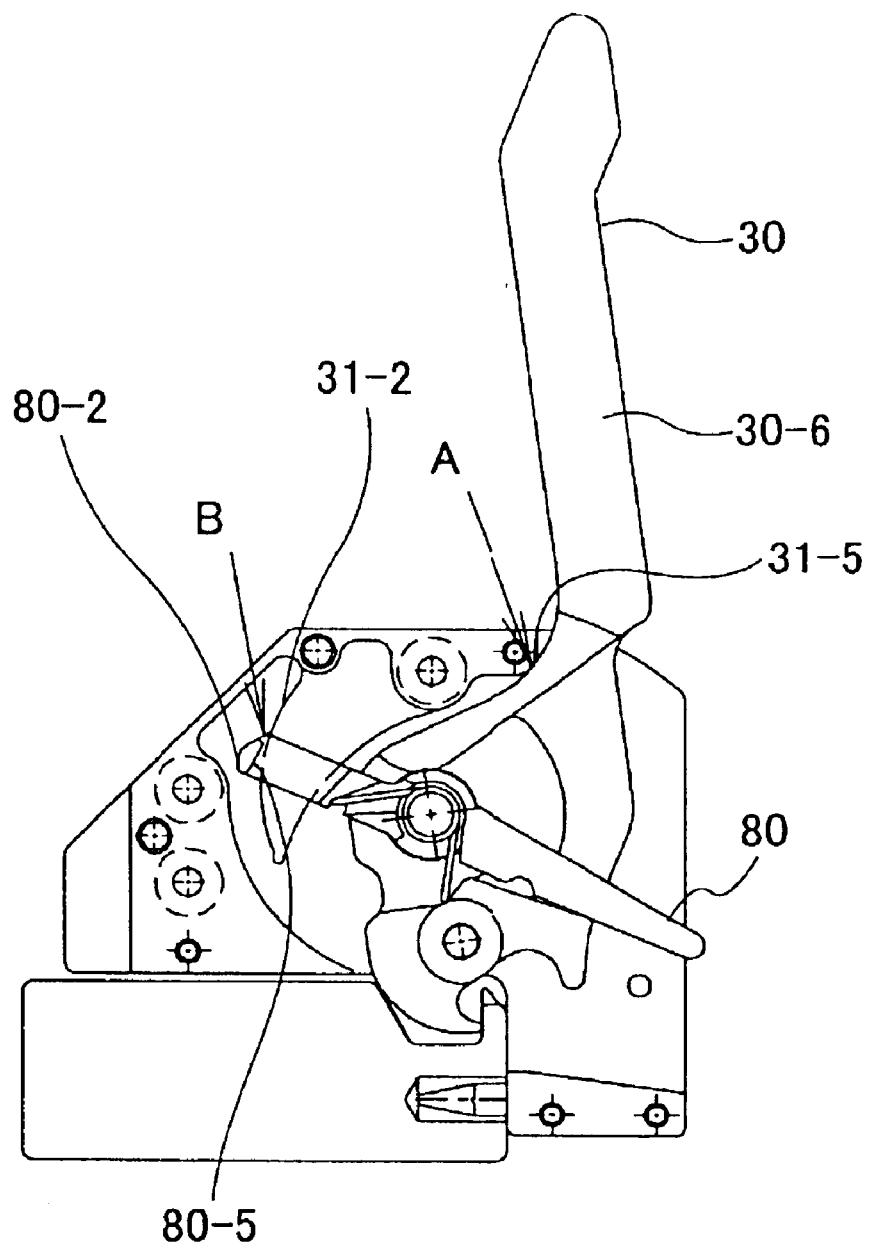
FIG. 26 is a view showing a state where the lever 30 is further rotated counterclockwise from the state shown in FIG. 24.

FIG. 26 is a view showing a state where the lever 30 is further rotated counterclockwise from a state shown in FIG. 24. In this case, the arm part 30-6 of the lever 30 comes in contact with the rotation stopping part 31-5 as shown by the arrow A in FIG. 26. Therefore, the leverage applied to the lever 30 does not cause further rotation. Because of this, damaging force on the connection between the connector part 40 of the electronic circuit unit 1 and the connector 150 of the back board wiring board 103 is prevented. Here, during the states shown in FIGS. 24 through 26, the inside surface 80-5 of the engaging part 80-2 of the stopper 80 and the engaging surface 31-2 have a gap shown by an arrow B in FIG. 26.

Actions of the electronic circuit unit 1 being pulled out from the shelf 100 are shown in FIGS. 27 through 33.

Figure 27:
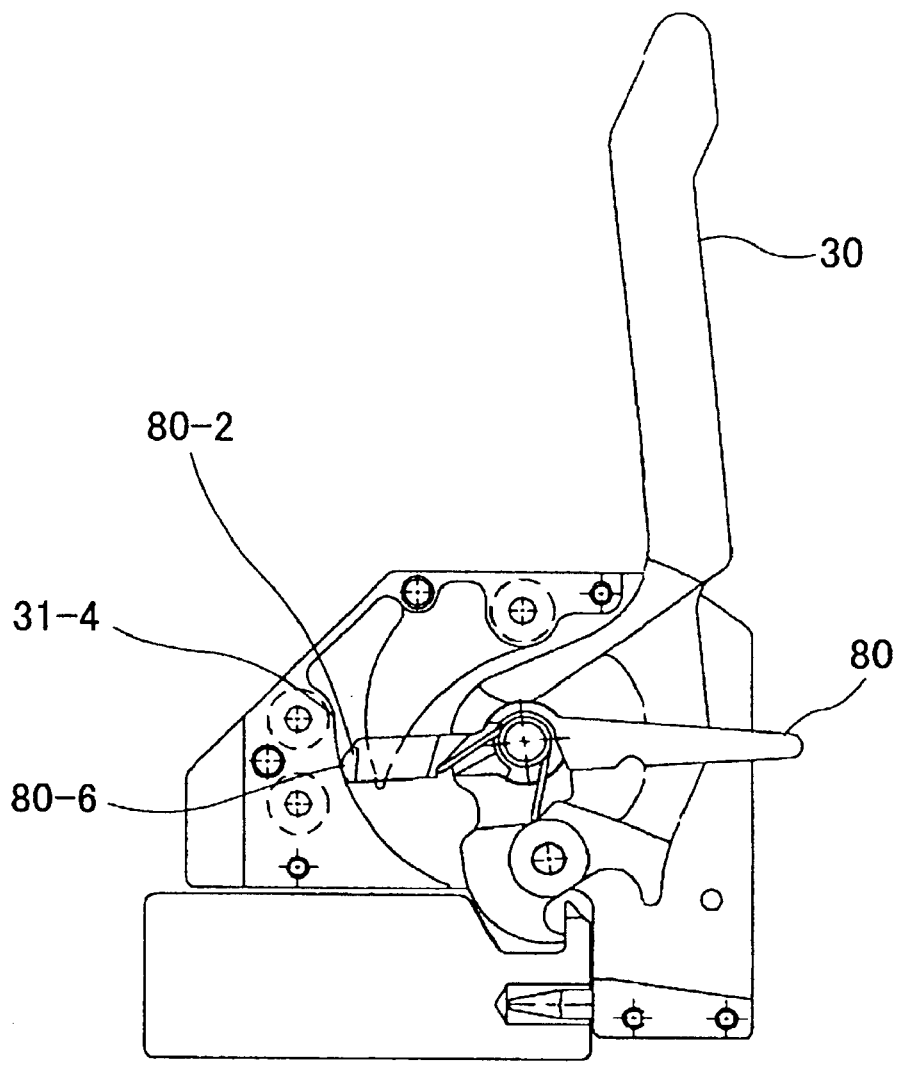
FIG. 27 is a view showing that the engagement of the inside surface 80-5 of the engaging part 80-2 of the stopper 80 with the engaging surface 31-2 is off (no longer engaging) from the state shown in FIG. 26.

FIG. 27 is a view showing that the engagement of the inside surface 80-5 of the engaging part 80-2 of the stopper 80 with the engaging surface 31-2 is off from the state shown in FIG. 26. That is, the stopper 80 is rotated counterclockwise from the state shown in FIG. 26, in a state shown in FIG. 27. As shown in FIG. 26, the gap is formed between the engaging part of the stopper 80 and the engaging part 31-2. Accordingly, it is possible to rotate the stopper 80 with a light force easily. The stopper 80 is rotated counterclockwise, so that the outside surface of the engaging part 80-2 of the stopper 80 comes in contact with the engaging lifting guide surface 31-4.

Figure 28:
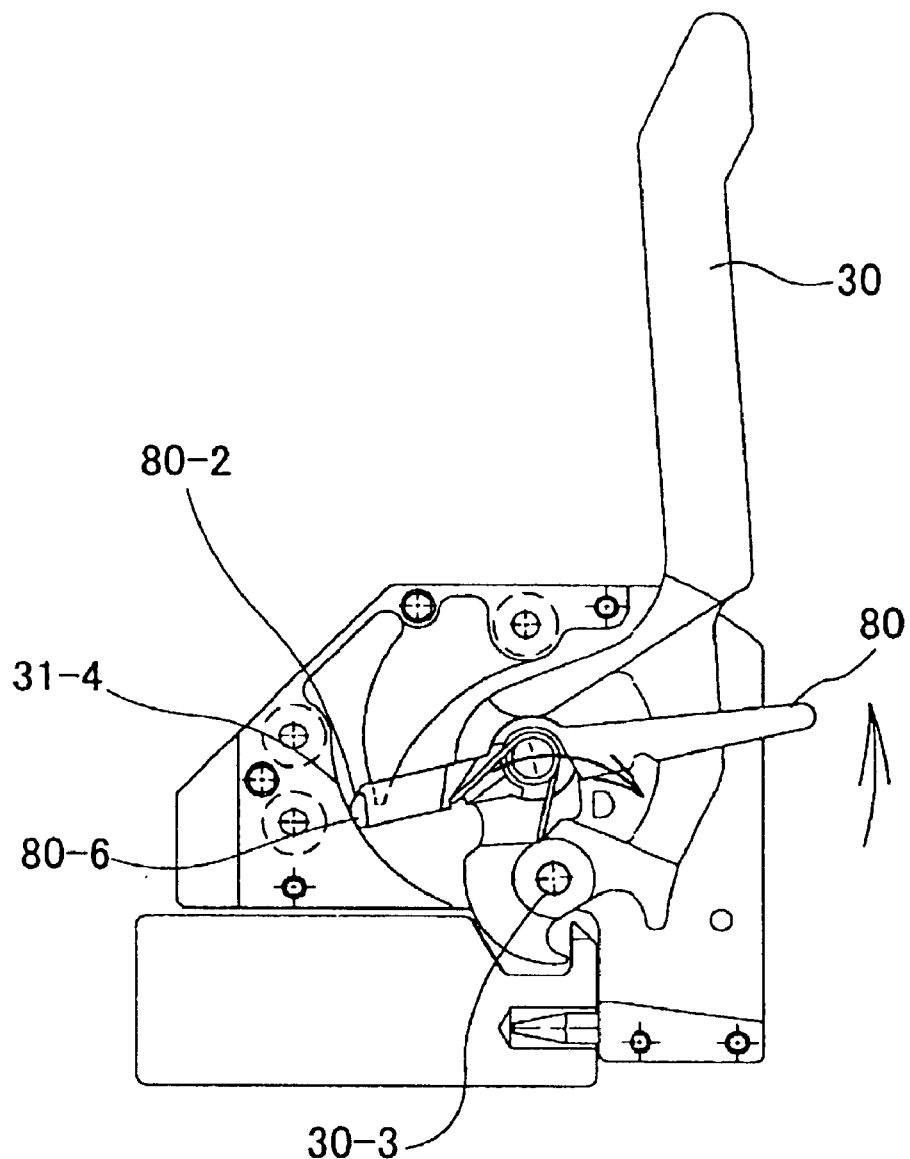
FIG. 28 is a view showing a state where the stopper 80 is further rotated counterclockwise from a state shown in FIG. 27.

FIG. 28 is a view showing a state where the stopper 80 is further rotated counterclockwise from the state shown in FIG. 27. The outside surface 80-6 of the engaging part 80-2 of the stopper 80 moves on the engaging lifting guide surface 31-4. On the other hand, the lever 30 is rotated clockwise by the force of the spring 55 wherein the rotation center part 30-3 is the center of the rotation of the lever 30.

Figure 29:
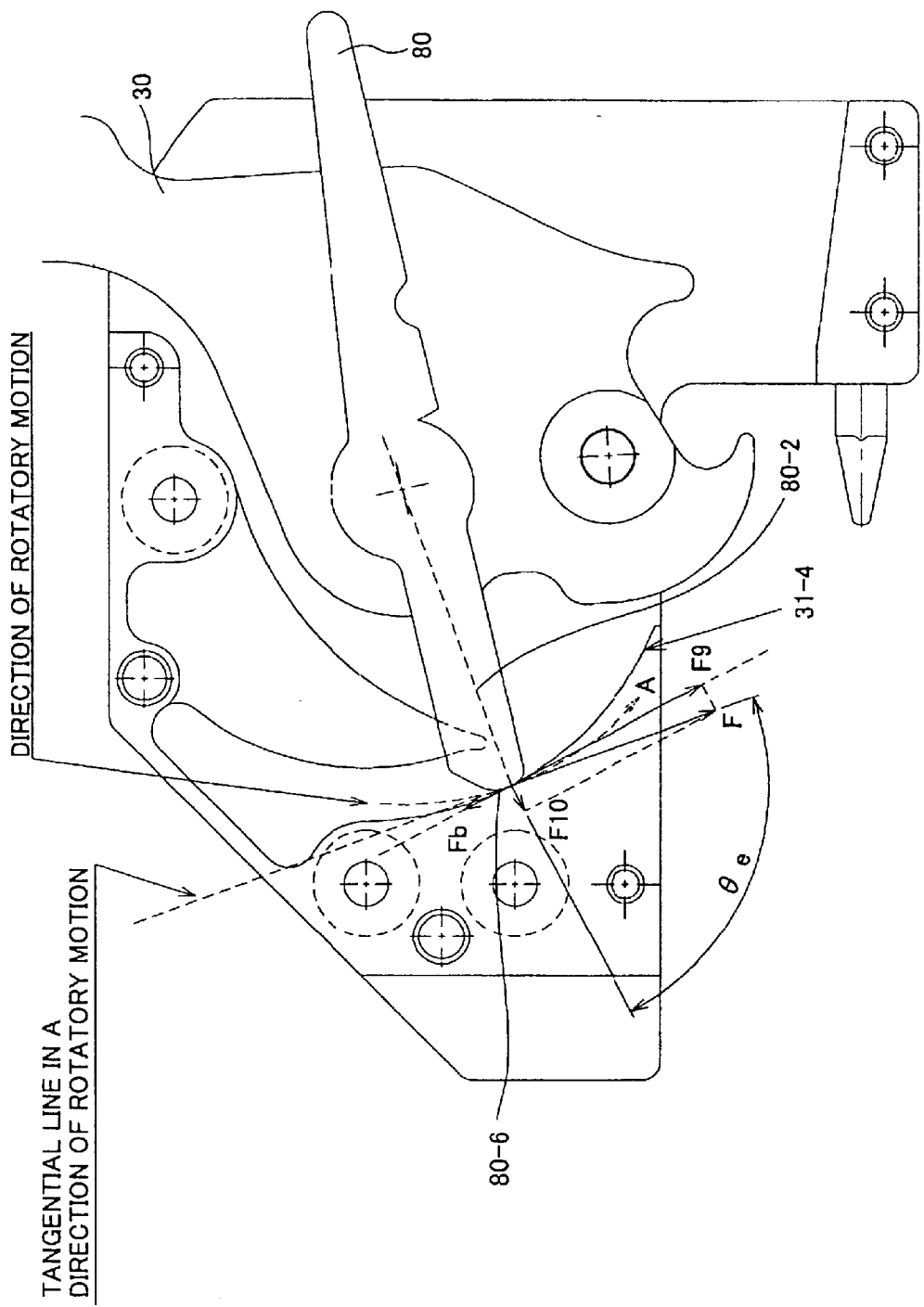
FIG. 29 is a view showing a principle of the state shown in FIG. 28.

FIG. 29 is a view showing a principle in the state shown in FIG. 28. Referring to FIG. 29, the stopper 80 is rotated in a direction shown by the dotted arrow A (counterclockwise), so that the force F occurs in a direction of the tangential line of the direction of the rotation of the engaging part 80-2 of the stopper 80. The force F can be resolved into a force F9 and a force F10.

The force F9 F3 is a force in the direction of a tangential line at a position of the insertion lifting guide surface 31-4 that is a curved surface where the outside surface 80-6 of the engaging part 80-2 of the stopper 80 comes in contact. That is, the force F9 is expressed as F9=F×sin $\theta_e$. The force F10 is a force in a right-angled direction against the tangential line at a position of the insertion lifting guide surface 31-4 that is a curved surface where the outside surface 80-6 of the engaging part 80-2 of the stopper 80 comes in contact. That is, the force F10 is expressed as F10=F×cos $\theta_e$. In this case, in a case of F9>F10×$\mu_0$+$F_b$, the stopper 80 slides on the insertion lifting guide surface 31-4, wherein the friction coefficient of the surface where the outside surface 80-6 of the engaging part 80-2 of the stopper 80 comes in contact is defined as $\mu_0$ and the force generated at the insertion lifting guide surface 31-4 by the spring 55 is defined as $F_b$. According to the above mentioned principle, the insertion lifting guide surface 31-4 is set so as to have the slidable angle $\theta_e$. The outside surface 80-6 of the engaging part 80-2 of the stopper 80 slides on the insertion lifting guide surface 31-4 while pushing against the insertion lifting guide surface 31-4.

Figure 30:
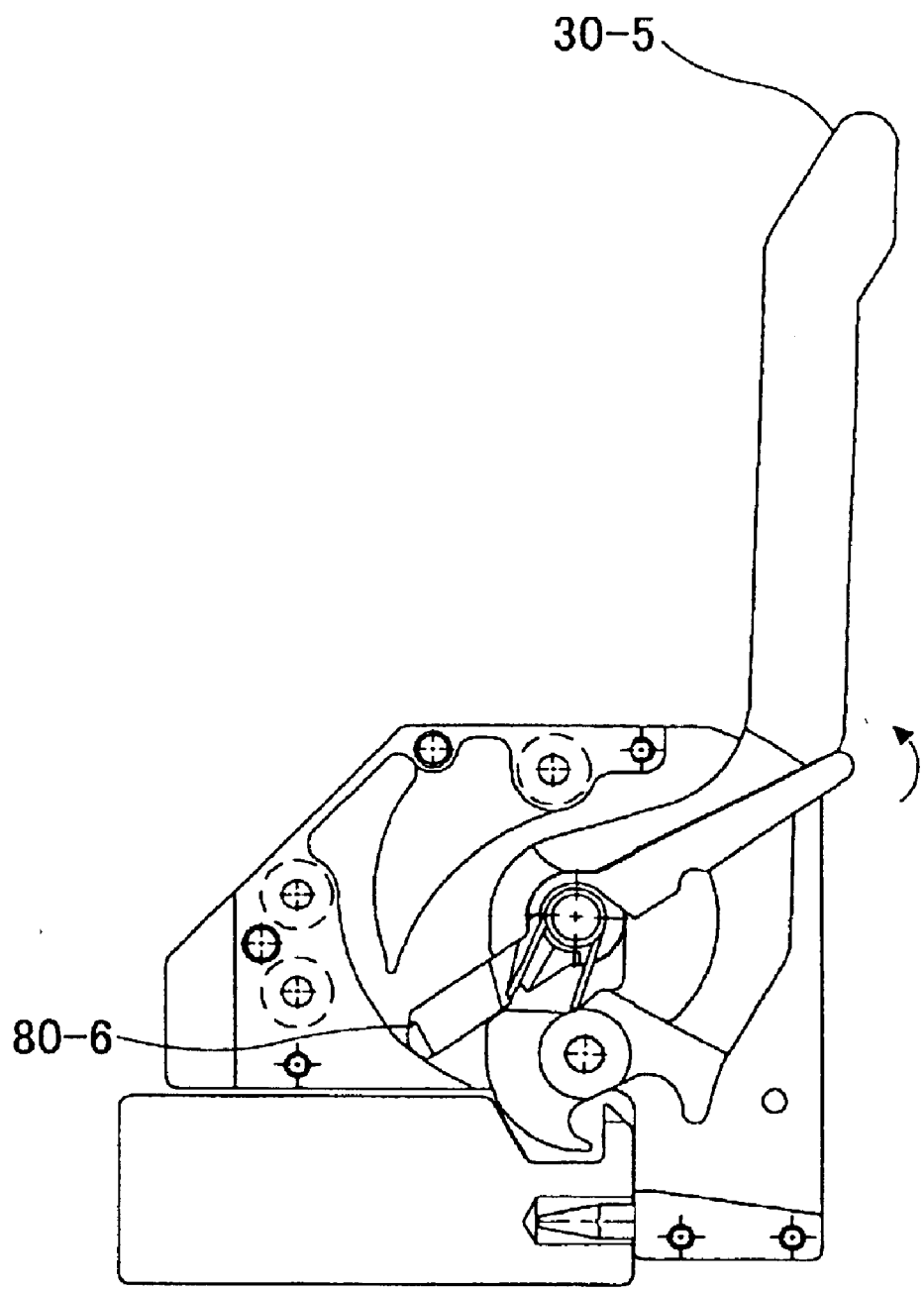
FIG. 30 is a view showing a final state with regard to lifting of the lock of the lever 30.

FIG. 30 is a view showing a final stage with regard to lifting of the lock of the lever 30 wherein the stopper 80 is further rotated from the state shown in FIG. 28. The stopper 80 is further rotated counterclockwise from the state shown in FIG. 28 so that the lever 30 is rotated clockwise automatically by the force of the spring 55. In this state, the operation part 30-5 of the lever 30 is located nearer to the operator than the state shown in FIG. 26. Hence, the operator can rotate the head end of the operation part 30-5 of the lever 30 clockwise with his finger, without inserting the finger deeply.

If the lever 30 protrudes from the surface board 50 when the electronic circuit unit 1 is mounted on the shelf 100, it is difficult to see indication parts, such as a light-emitting diode, provided on the surface board 50. As shown in FIG. 5, the front surface of the surface board 50 is situated at the same position as a position where the front surface of the lever 30 is situated. That is, the surface board 50 and the front surface of the lever 30 form same surface. However, in a state shown in FIG. 30, the operation part 30-5 of the lever 30 is located nearer to the operator than the state shown in FIG. 26. Accordingly, the operator can operate the lever 30 without inserting the finger deeply. Hence, this mechanism has good operability and is convenient.

Figure 31:
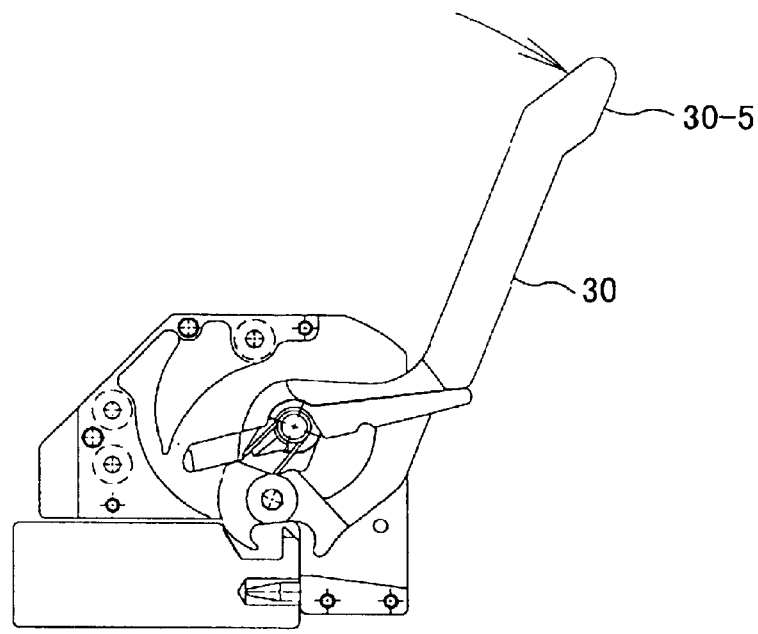
FIG. 31 is a view showing a state where the operation part 30-5 of the lever 30 is rotated clockwise from the state shown in FIG. 30.

FIG. 31 is a view showing a state where the operation part 30-5 of the lever 30 is rotated clockwise from the state shown in FIG. 30.

Figure 32:
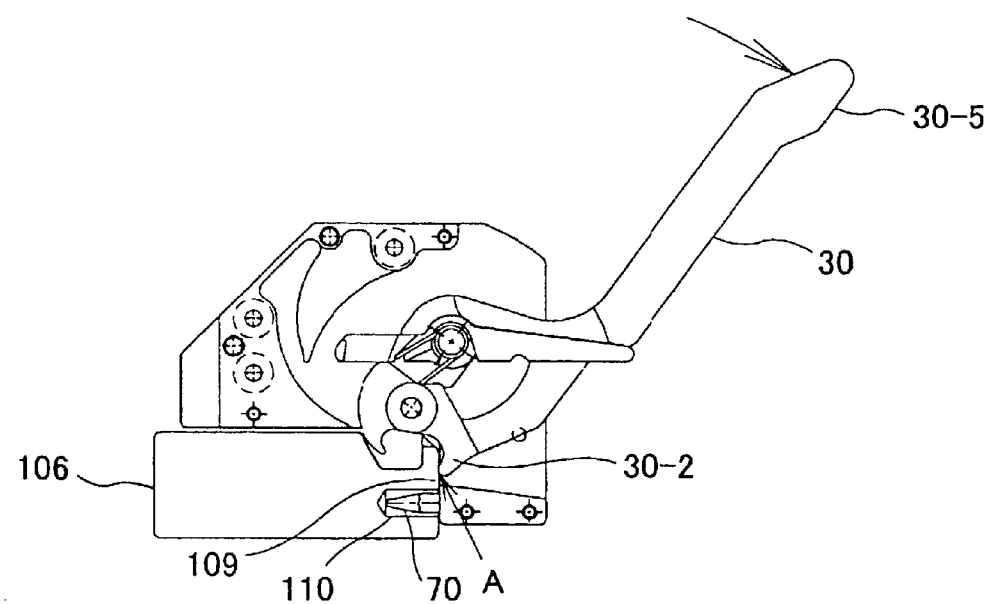
FIG. 32 is a view showing a state where the operation part 30-5 of the lever 30 is further rotated clockwise from the state shown in FIG. 31 so that the outside of the projection part 109 of the front frame 106 comes in contact with the claw part 30-2 of the lever 30 as shown by the arrow A.

FIG. 32 is a view showing a state where the operation part 30-5 of the lever 30 is further rotated clockwise from the state shown in FIG. 31 so that the outside of the projection part 109 of the front frame 106 comes in contact with the claw part 30-2 of the lever 30 as shown by the arrow A.

From the state shown in FIG. 27 to the state shown in FIG. 32, the guide pin 70 of the lever 30 remains inserted in the guide hole forming part 110 of the front frame 106. Therefore, the electronic circuit unit 1 does not move. The operator can rotate the lever 30 with a light force.

Figure 33:
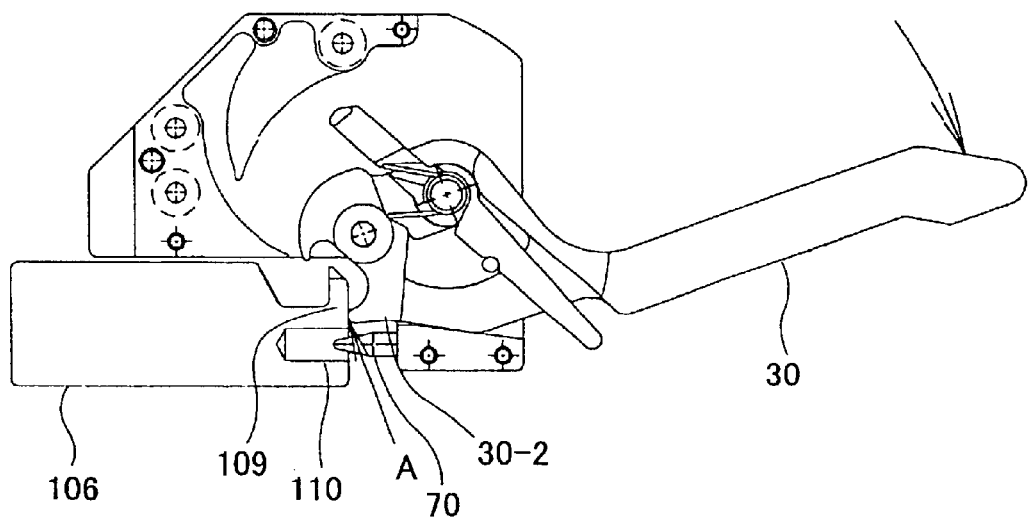
FIG. 33 is a view showing a state where the electrical circuit unit 1 is pulled from the shelf 100 by using the leverage.

FIG. 33 is a view showing a state where the electrical circuit unit 1 is pulled from the shelf 100 by using the leverage.

Referring to FIG. 33, the operator can rotate the lever 30 clockwise by using the leverage, wherein a point (shown by the arrow A) where the claw part 30-2 of the lever 30 comes in contact with the outside of the projection part 109 of the front frame 106 is a fulcrum. As a result of this, engagement between the guide pin 70 of the lever 30 and the guide hole forming part 110 of the front frame 106 is off, so that the electrical circuit unit 1 can be pulled from the shelf 100.

Thus, it is possible to securely insert and remove the electronic circuit unit 1 against the shelf 100 by using the mechanism for inserting and removing of the electronic circuit unit 1.

The present invention is not limited to these embodiments, but variations and modifications may be made without departing from the scope of the present invention.

This patent application is based on Japanese priority patent application No. 2002-188324 filed on Jun. 27, 2002, the entire contents of which are hereby incorporated by reference.

What is claimed is:

1. A mechanism for inserting and removing an electronic circuit unit against a shelf of an electrical device where the electronic circuit unit is installed, wherein the shelf includes a groove forming part, the electrical circuit unit includes a rotatable lever having a head end where a fixing part is provided; a rotatable stopper connected to the lever and having a head end where an engaging part is provided; and a housing member housing the lever and the stopper where an engaging surface engaging with the engaging part of the stopper is provided inside thereof, the electrical circuit unit is locked with the shelf by rotating the lever so as to engage the groove forming part of the shelf with the fixing part of the lever, and the engaging part of the stopper engages the engaging surface of the housing member such that the engagement between the engaging surface of the housing member and the engaging part of the stopper is not released even if a force to release the fixing part of the lever from the groove forming part of the shelf is applied to the lever.

2. The mechanism for inserting and removing an electronic circuit unit, as claimed in claim 1, wherein the engaging surface of the housing member is a curved surface, the engaging surface of the housing member is engaged with the engaging part of the stopper by crossing the engaging surface of the housing member with an orbit of the rotation of the engaging part of the stopper, and the engagement between the engaging surface of the housing member and the engaging part of the stopper is not released even if a force to release the fixing part of the lever from the groove forming part of the shelf is applied to the lever.

3. The mechanism for inserting and removing an electronic circuit unit, as claimed in claim 1, wherein the housing member further includes a rotation stopping part, and the lever cannot be moved, after the lever is further rotated so that the lever comes in contact with the rotation stopping part.

4. The mechanism for inserting and removing an electronic circuit unit, as claimed in claim 1, wherein the housing member further includes a housing part having a rotational axis against which the lever is rotated; and a cover part facing to the housing part, and the engaging surface is provided to the housing part and/or the cover part.

5. The mechanism for inserting and removing an electronic circuit unit, as claimed in claim 1, wherein the housing member further includes an engaging lifting guide surface, and the engaging part of the stopper is guided on the engaging lifting guide surface by rotating the stopper and then the lever is rotated, so that the fixing part of the lever is released from the groove forming part of the shelf.

6. The mechanism for inserting and removing an electronic circuit unit, as claimed in claim 1, wherein the stopper is connected to the lever through a spring so that the stopper and the lever are rotated by a force of the spring.

7. The mechanism for inserting and removing an electronic circuit unit, as claimed in claim 1, wherein the shelf further includes a guide hole having a circular configuration, the housing member further includes a guide pin inserting into the guide hole forming part, and the guide pin has a configuration wherein the guide pin and the guide hole forming part are positioned in a horizontal direction and the guide pin can be moved in the guide hole forming part in a longitudinal direction.

8. The mechanism for inserting and removing an electronic circuit unit, as claimed in claim 1, wherein the electrical circuit unit further includes a surface board where the lever is provided, and the housing member and the surface board are formed in a body.

9. The mechanism for inserting and removing an electronic circuit unit, as claimed in claim 8, wherein the electronic circuit unit further includes an electrical circuit board where a hole forming part for positioning is provided, the housing member for housing the lever includes a pin, the surface board includes a piercing hole forming part, the pin pierces to the piercing hole forming part of the surface board and the hole forming part for positioning if the electrical circuit board and thereby the electrical circuit board and the lever are positioned.

10. A mechanism for inserting and removing an electronic circuit unit against a shelf of an electrical device where the electronic circuit unit is installed wherein the shelf includes a groove forming part, the electronic circuit unit includes a rotatable lever having a head end where a fixing part is provided;

a rotatable stopper connected to the lever and having a head end where an engaging part is provided; and a housing member housing the lever and the stopper where a projection part fixing an insertion guide surface where the engaging part is guided to the stopper by rotating the lever is provided inside thererof, and if a designated force is applied to the lever, the lever is rotated and the fixing part of the lever is engaged with the groove forming part of the shelf, and fixing of the stopper by the projection part of the housing member is lifted so that the engaging part of the stopper comes in contact with the insertion guide surface.

11. The mechanism for inserting and removing an electronic circuit unit, as claimed in claim 10, wherein the stopper further includes another groove forming part, and the stopper is fixed to the projection part by engaging the other groove forming part with the projection part of the housing member.

* * * * *